US012628519B2

(12) United States Patent
Woo et al.

(10) Patent No.: US 12,628,519 B2
(45) Date of Patent: May 12, 2026

(54) DISPLAY DEVICE WITH CONNECTED BASE UNITS

(71) Applicant: SAMSUNG DISPLAY CO., LTD., Yongin-si (KR)

(72) Inventors: Minkyu Woo, Yongin-si (KR); Gyungsoon Park, Yongin-si (KR); Seonyoung Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 542 days.

(21) Appl. No.: 18/162,762

(22) Filed: Feb. 1, 2023

(65) Prior Publication Data

US 2023/0247881 A1      Aug. 3, 2023

(30) Foreign Application Priority Data

Feb. 3, 2022    (KR) ........................ 10-2022-0014385

(51) Int. Cl.
  *H10K 59/131*       (2023.01)
  *H10K 59/80*        (2023.01)
  *H10K 102/00*       (2023.01)
(52) U.S. Cl.
  CPC ....... *H10K 59/1315* (2023.02); *H10K 59/873* (2023.02); *H10K 2102/351* (2023.02)
(58) Field of Classification Search
  CPC ............. H10K 59/1315; H10K 59/873; H10K 2102/351
  USPC .................................. 257/40, 59, 91, 99, 100
  See application file for complete search history.

(56) References Cited

U.S. PATENT DOCUMENTS

| | | | | |
|---|---|---|---|---|
| 2015/0049428 A1* | 2/2015 | Lee | ...................... | G06F 1/1652 |
| | | | | 361/679.27 |
| 2020/0388666 A1* | 12/2020 | Park | ...................... | H10D 86/60 |
| 2021/0005700 A1* | 1/2021 | Park | ..................... | H10K 50/844 |
| 2021/0013433 A1 | 1/2021 | Zhai | | |
| 2021/0143243 A1 | 5/2021 | Ban | | |
| 2022/0005834 A1* | 1/2022 | Lee | ...................... | H10D 86/60 |
| 2024/0188351 A1* | 6/2024 | Wang | ................... | H10K 59/124 |

FOREIGN PATENT DOCUMENTS

| | | |
|---|---|---|
| CN | 112230799 A | 1/2021 |
| KR | 1020210005452 A | 1/2021 |

* cited by examiner

*Primary Examiner* — Eric W Jones
(74) *Attorney, Agent, or Firm* — CANTOR COLBURN LLP

(57) ABSTRACT

A display device includes: a substrate including a first area and a first connection area extending from the first area; an inorganic insulating layer disposed on the substrate in the first area and having a side surface; an organic layer disposed on the substrate, covering the side surface of the inorganic insulating layer and arranged in the first connection area; a first organic insulating layer disposed on the inorganic insulating layer in the first area and having a first side surface; and a first wire disposed on the first organic insulating layer in the first area and disposed on the organic layer in the first connection area, where the first wire extends along the first side surface in a direction from the first area to the first connection area.

17 Claims, 16 Drawing Sheets

DISPLAY DEVICE WITH CONNECTED BASE UNITS

This application claims priority to Korean Patent Application No. 10-2022-0014385, filed on Feb. 3, 2022, and all the benefits accruing therefrom under 35 U.S.C. § 119, the content of which in its entirety is herein incorporated by reference.

BACKGROUND

1. Field

One or more embodiments relate to a display device.

2. Description of the Related Art

With the development of display devices for visually displaying electric signals, various display devices having desired characteristics, such as small thicknesses, light weights, and low power consumption, are introduced. For example, flexible display devices capable of being folded or rolled are introduced. Recently, research and development of stretchable display devices having shapes that may variously change have been actively conducted.

Such a display device may include various wires and a light-emitting element connected to the wires. The various wires may be a power supply wire for transmitting a power voltage, or a signal line for transmitting a signal.

SUMMARY

One or more embodiments include a display device having a shape that may variously change and in which various wires maintain low resistance.

According to one or more embodiments, a display device includes: a substrate including a first area and a first connection area extending from the first area; an inorganic insulating layer disposed on the substrate in the first area and having a side surface; an organic layer disposed on the substrate, covering the side surface of the inorganic insulating layer and arranged in the first connection area; a first organic insulating layer disposed on the inorganic insulating layer in the first area and having a first side surface, and a first wire disposed on the first organic insulating layer in the first area and disposed on the organic layer in the first connection area, where the first wire extends along the first side surface in a direction from the first area to the first connection area.

In an embodiment, the substrate may further include a second connection area extending from the first area, the organic layer may be further arranged in the second connection area, the first organic insulating layer may extend from the first area to the second connection area, and the display device may further include a second wire arranged between the organic layer and the first organic insulating layer.

In an embodiment, the display device may further include a second organic insulating layer disposed on the first wire and having a second side surface, where the first organic insulating layer may extend in a direction from the second side surface to the second connection area.

In an embodiment, the second organic insulating layer may extend from the first area to the first connection area, the first wire may be arranged between the organic layer and the second organic insulating layer in the first connection area, and a thickness of the second organic insulating layer in the first connection area may be the same as a thickness of the first organic insulating layer in the second connection area.

In an embodiment, the first wire in the first connection area may be spaced apart from the substrate by a first distance in a perpendicular direction to a top surface of the substrate, the second wire in the second connection area may be spaced apart from the substrate by a second distance in the perpendicular direction to the top surface of the substrate, and the first distance and the second distance may be the same.

In an embodiment, a contact hole may be defined through the first organic insulating layer in the first area, and the first wire and the second wire may be connected to each other through the contact hole.

In an embodiment, the first wire and the second wire may include a same material as each other.

In an embodiment, the display device may further include a second organic insulating layer disposed on the first wire, wherein the second organic insulating layer may extend along the first side surface in a direction from the first area to the first connection area.

In an embodiment, the substrate may further include a second area spaced apart from the first area, the first connection area may extend from the first area to the second area, and an edge of the first area, an edge of the first connection area, and an edge of the second area in a plan view may define at least a portion of an opening area of the substrate.

In an embodiment, the display device may further include: a second organic insulating layer disposed on the first wire in the first area; and a light-emitting element disposed on the second organic insulating layer.

According to one or more embodiments, a display device includes: a substrate including a first area, and a first connection area, a second connection area, a third connection area and a fourth connection area, which extend from the first area, respectively; a first organic insulating layer disposed on the substrate and extending along the second connection area, the first area, and the fourth connection area; a second organic insulating layer disposed on the first organic insulating layer in the first area, and extending from the first area to each of the first connection area and the third connection area; a first wire arranged between the first organic insulating layer and the second organic insulating layer in the first area, and extending from the first area to each of the first connection area and the third connection area; and a second wire arranged between the substrate and the first organic insulating layer in the first area, and extending from the first area to each of the second connection area and the fourth connection area.

In an embodiment, a thickness of the second organic insulating layer in the first connection area may be the same as a thickness of the first organic insulating layer in the second connection area.

In an embodiment, the display device may further include: an inorganic insulating layer arranged between the substrate and the first organic insulating layer in the first area, and having a side surface; and an organic layer disposed on the substrate, covering the side surface of the inorganic insulating layer and arranged in each of the first connection area and the second connection area, where the first wire in the first connection area may be spaced apart from the substrate by a first distance in a perpendicular direction to a top surface of the substrate, the second wire in the second connection area may be spaced apart from the substrate, by a second distance in the perpendicular direction to the top surface of the substrate, and the first distance may be the same as the second distance.

In an embodiment, the first organic insulating layer may include a first edge, and the second organic insulating layer may extend to the first connection area across the first edge in a plan view.

In an embodiment, the second organic insulating layer may include a second edge, and the first organic insulating layer may extend to the second connection area across the second edge in a plan view.

In an embodiment, the first wire and the second wire may cross each other in the first area in a plan view, a contact hole may be defined through the first organic insulating layer in the first area, and the first wire and the second wire may be connected to each other through the contact hole.

In an embodiment, the first wire and the second wire may include a same material as each other.

In an embodiment, the substrate may further include a second area spaced apart from the first area, the first connection area may extend from the first area to the second area, and an edge of the first area, an edge of the first connection area, and an edge of the second area may define at least a portion of an opening area of the substrate.

In an embodiment, the first organic insulating layer may have a first side surface, and the first wire may extend along the first side surface in a direction from the first area to the first connection area.

In an embodiment, the display device may further include a light-emitting element disposed on the second organic insulating layer in the first area.

BRIEF DESCRIPTION OF THE DRAWINGS

The above and other features of certain embodiments of the disclosure will be more apparent from the following description taken in conjunction with the accompanying drawings, in which.

4

Figure 11A:
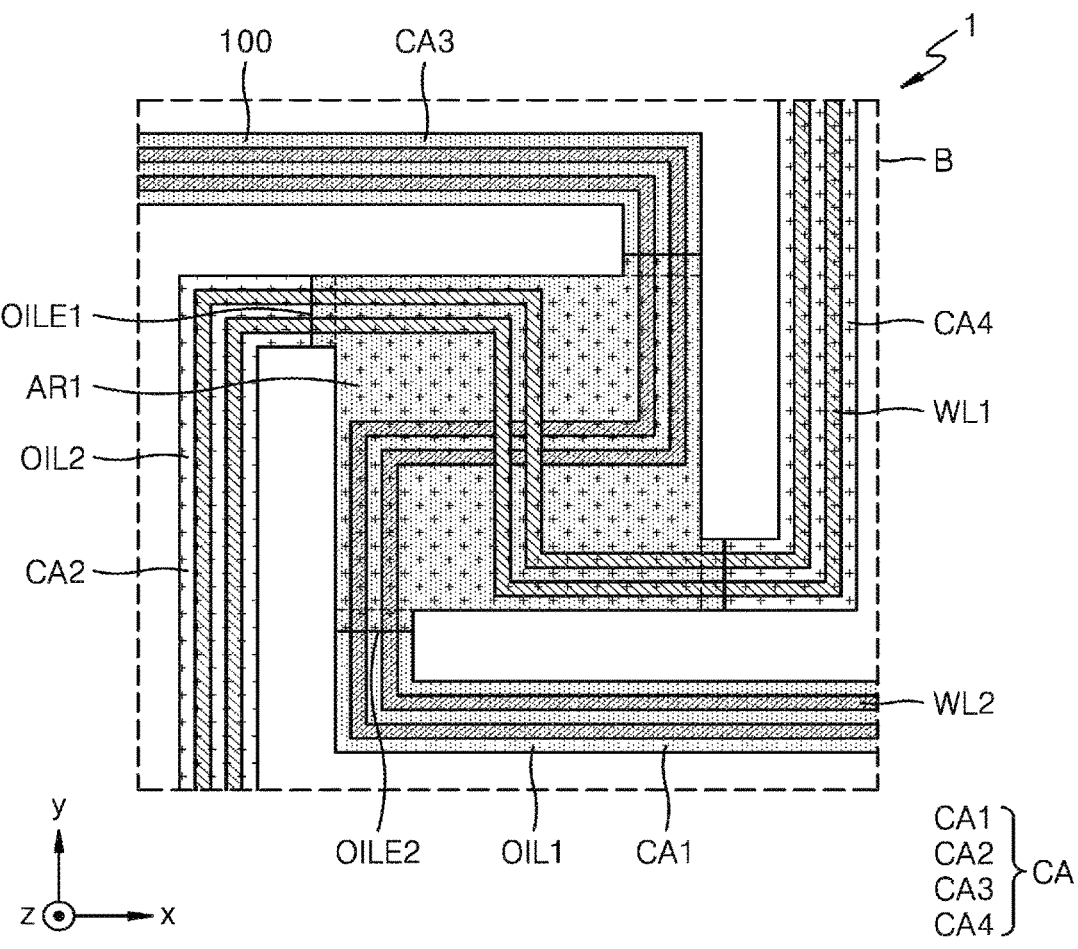
FIG. 11A is an enlarged view of the portion B of the display device of FIG. 5, according to an alternative embodiment.
Figure 11B:
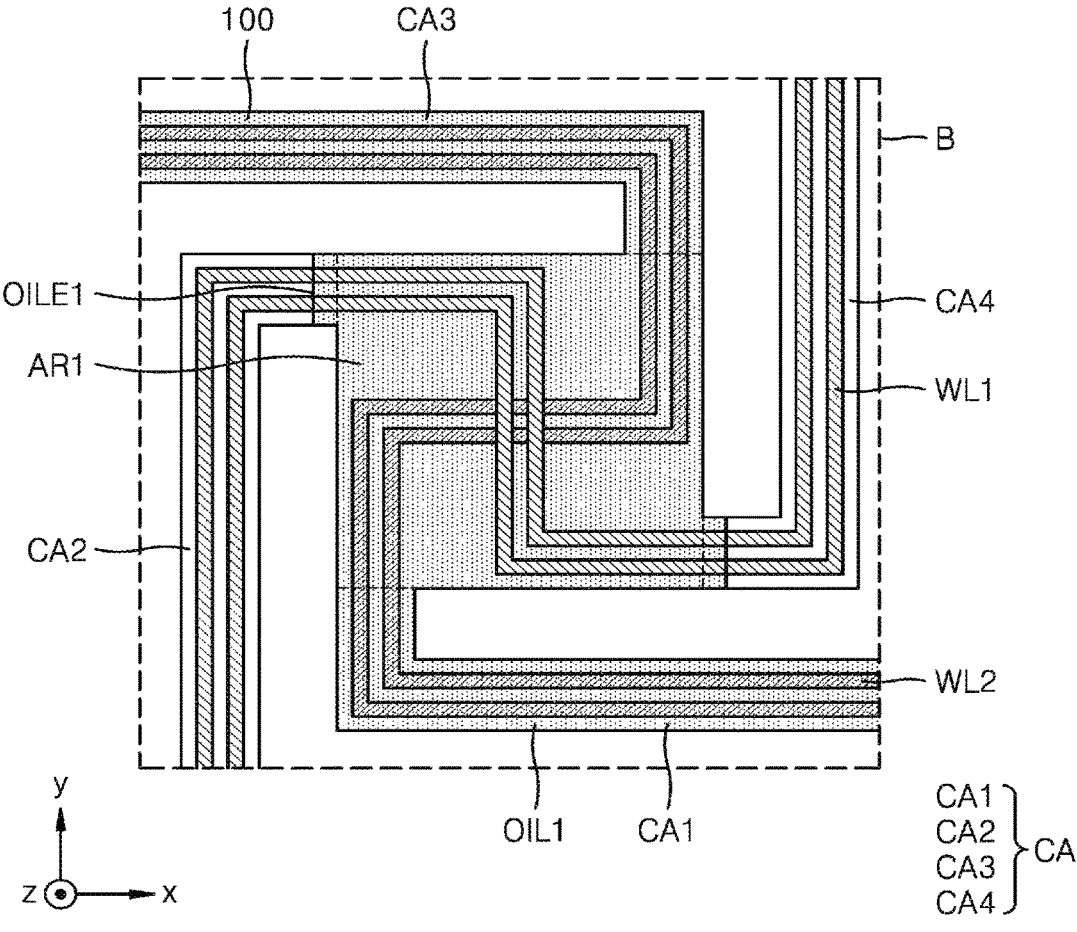
Figure 11C:
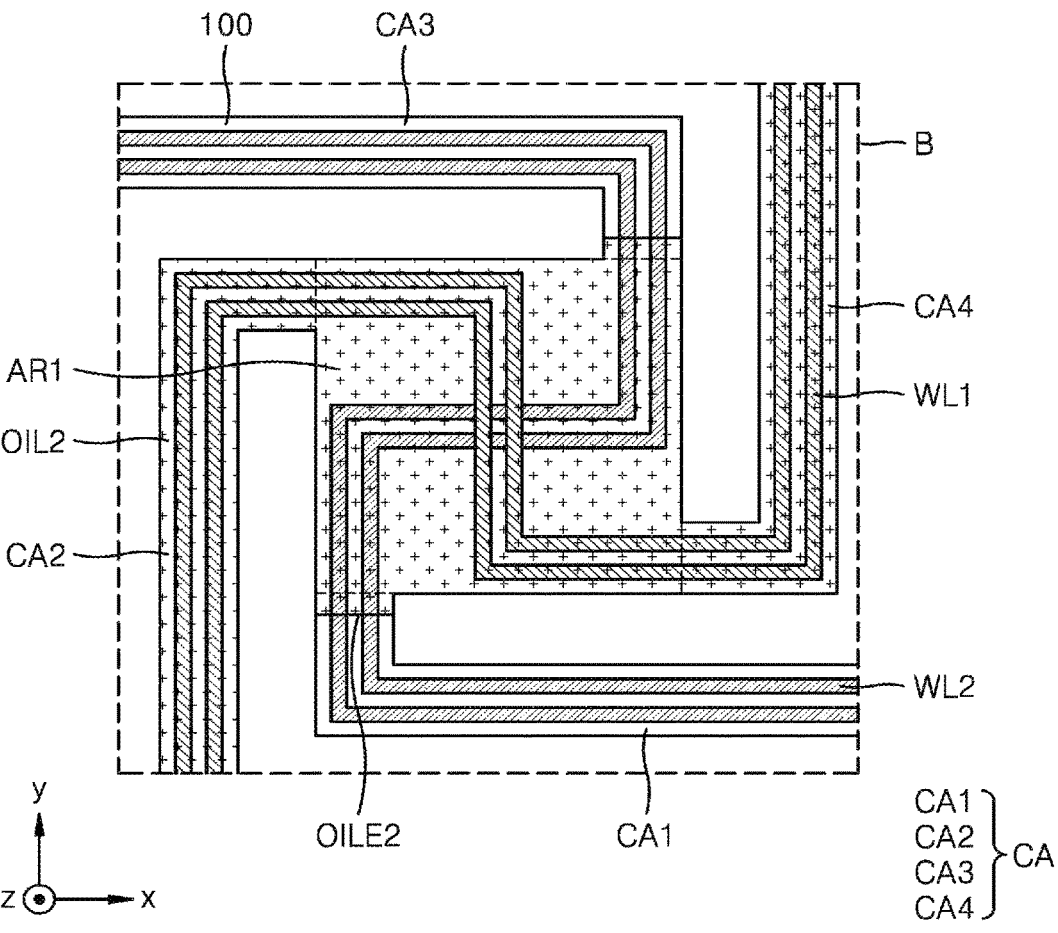

FIGS. 11B and 11C are each a plan view showing some of components of FIG. 11A.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout, and any repetitive detailed description of the like elements may be omitted or simplified.

It will be understood that when an element is referred to as being "on" another element, it can be directly on the other element or intervening elements may be present therebetween. In contrast, when an element is referred to as being "directly on" another element, there are no intervening elements present.

The disclosure may have various modifications and various embodiments, and specific embodiments are illustrated in the drawings and are described in detail in the detailed description. Effects and features of the disclosure and methods of achieving the same will become apparent with reference to embodiments described in detail with reference to the drawings. However, the disclosure is not limited to the embodiments described below, and may be implemented in various forms.

The terms, such as "first," "second," and the like are not used in limited meanings, but are used to distinguish one component from another component.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or element is referred to as being "formed on" another layer, area, or element, it can be directly or indirectly formed on the other layer, region, or element. That is, for example, intervening layers, regions, or elements may be present.

In the drawings, for convenience of description, sizes of components may be exaggerated or reduced. In other words, because sizes and thicknesses of components in the drawings are arbitrarily illustrated for convenience of explanation, the disclosure is not necessarily limited thereto.

When a certain embodiment may be implemented differently, a specific process order may be performed differently from the described order. For example, two consecutively described processes may be performed substantially at the same time or performed in an order opposite to the described order.

When a layer, region, component, or the like is connected to another layer, region, component, or the like, the layer, the region, the component, or the like may be not only directly connected thereto, but also indirectly connected thereto with an intervening layer, region, component, or the like therebetween. For example, in the specification, when a layer, region, component, or the like is electrically connected to another layer, region, component, or the like, the layer, region, component, or the like may be nor only directly electrically connected thereto, but also indirectly electrically connected thereto with an intervening layer, region, component, or the like therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims One or more embodiments will hereinafter be described in detail with reference to the accompanying drawings.

A display device is an apparatus for displaying an image, and may be a portable mobile device, such as a game device, a multimedia device, or a subminiature personal computer (PC). The display device described below may include a liquid crystal display, an electrophoretic display, an organic light-emitting display, an inorganic light-emitting display, afield emission display, a surface-conduction electron-emitter display, a quantum dot display, a plasma display, and a cathode ray display. Hereinafter, embodiments where the display device is an organic light-emitting display device will be described in detail, but where the display device may be one of various types of display device described above may be used in alternative embodiments.

Figure 1:
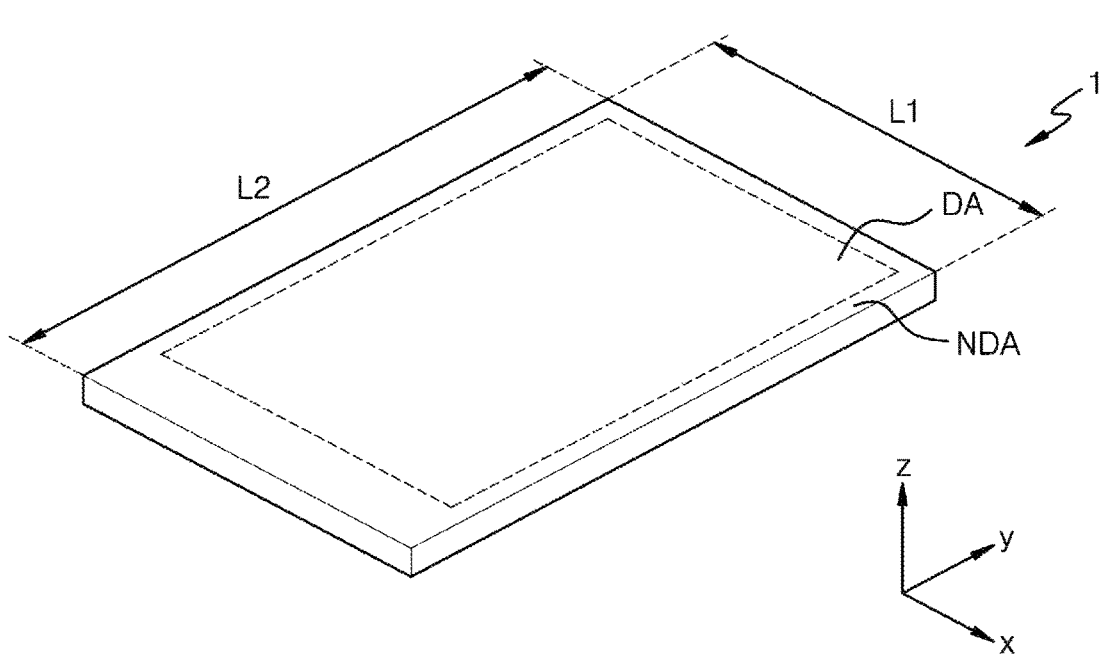
FIG. 1 is a perspective view schematically showing a display device according to an embodiment.
Figure 2A:
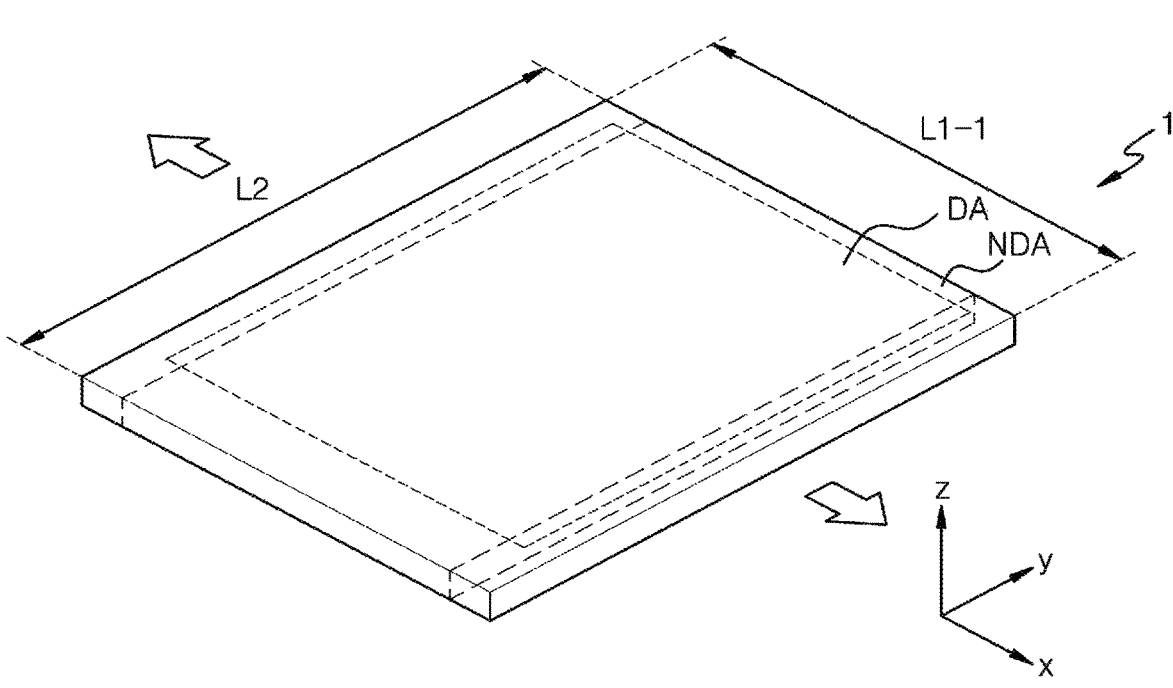
FIG. 2A is a perspective view showing a display device in a first state in which the display device of FIG. 1 extends in a first direction.
Figure 2B:
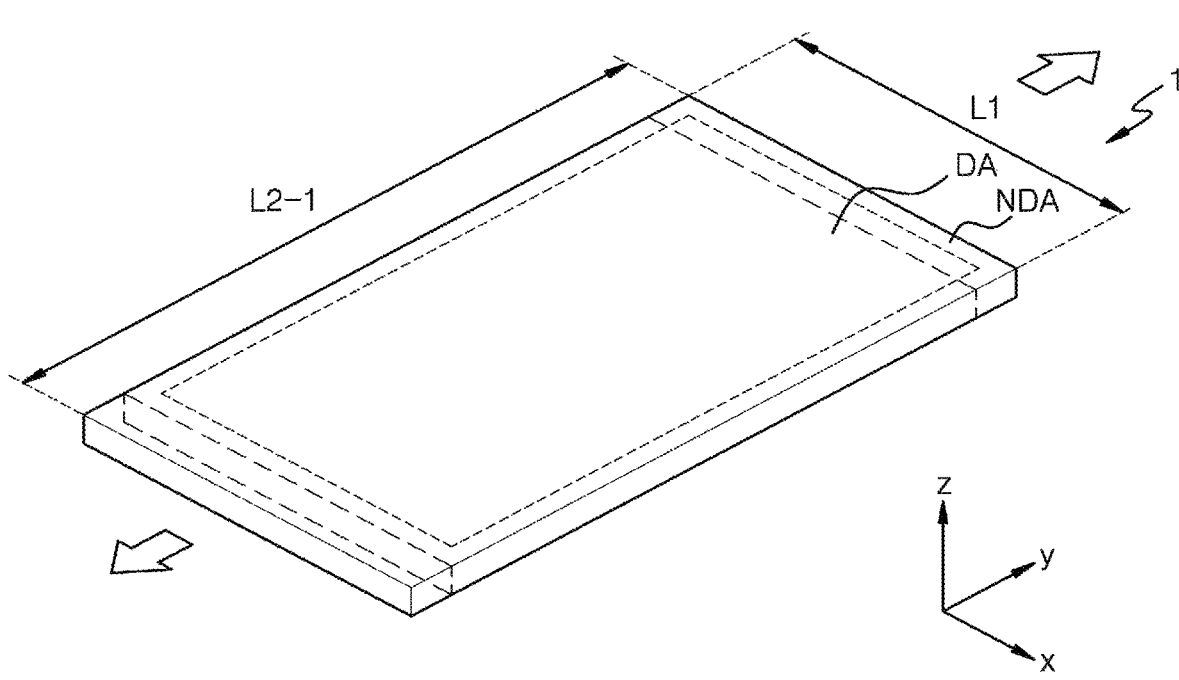
FIG. 2B is a perspective view showing a display device in a second state in which the display device of FIG. 1 extends in a second direction.

FIG. 1 is a perspective view schematically showing a display device 1 according to an embodiment. FIG. 2A is a perspective view showing a display device in a first state in which the display device 1 of FIG. 1 extends in a first direction. FIG. 2B is a perspective view showing a display device in a second state in which the display device 1 of FIG. 1 extends in a second direction.

Referring to FIG. 1, the display device 1 may display an image. In an embodiment, the display device 1 may include a display area DA and a non-display area NDA. A plurality of pixels may be arranged in the display area DA, and the display device 1 may provide a certain image by using light emitted from the plurality of pixels. The non-display area NDA may be adjacent to the display area DA. The non-display area NDA may surround at least a portion of the display area DA. According to an embodiment, the non-display area NDA may entirely surround the display area DA.

The display device 1 may include a first side L1 extending in the first direction, and a second side L2 extending in the second direction. The first side L1 and the second side L2 may be edges of the display device 1. The first direction and the second direction may cross each other. Here, a third direction may be a direction perpendicular to the first direction and the second direction, and may be a thickness direction of the display device 1. In an embodiment, for example, the first direction and the second direction may form an acute angle. In an alternative embodiment, for example, the first direction and the second direction may form an obtuse angle or a right angle. In embodiments, as shown in FIG. 1 and described herein, the first direction may be an x or −x direction, the second direction may be a y or −y direction, and the third direction may be a z or −z direction.

Referring to FIGS. 2A and 2B, an embodiment of the display device 1 may be a stretchable display device. Referring to FIG. 2A, the display device 1 may extend in the first direction (for example, the x direction or −x direction) when a tensile force is applied to the display device 1 in the first direction (for example, the x direction or −x direction). In this case, a first side L1-1 of FIG. 2A may be longer than the first side L1 of FIG. 1. According to an embodiment, the display device 1 may contract in the first direction (for example, the x direction or −x direction) when a contraction force is applied to the display device 1 in the first direction (for example, the x direction or −x direction). In this case, the first side L1-1 of FIG. 2A may be shorter than the first side L1 of FIG. 1.

Referring to FIG. 2B, the display device 1 may extend in the second direction (for example, the y direction or −y direction) when a tensile force is applied to the display device 1 in the second direction (for example, the y direction or −y direction). In this case, a second side L2-1 of FIG. 2B may be longer than the second side L2 of FIG. 1. The display area DA and the non-display area NDA may each extend in the second direction (for example, the y direction or −y direction). According to an embodiment, the display device 1 may contract in the second direction (for example, the y direction or −y direction) when a contraction force is applied to the display device 1 in the second direction (for example, the y direction or −y direction). In this case, the second side L2-1 of FIG. 2B may be shorter than the second side L2 of FIG. 1. In such an embodiment, the display device 1 may change into any one of various shapes when the tensile force or contraction force is applied to the display device 1.

Figure 3:
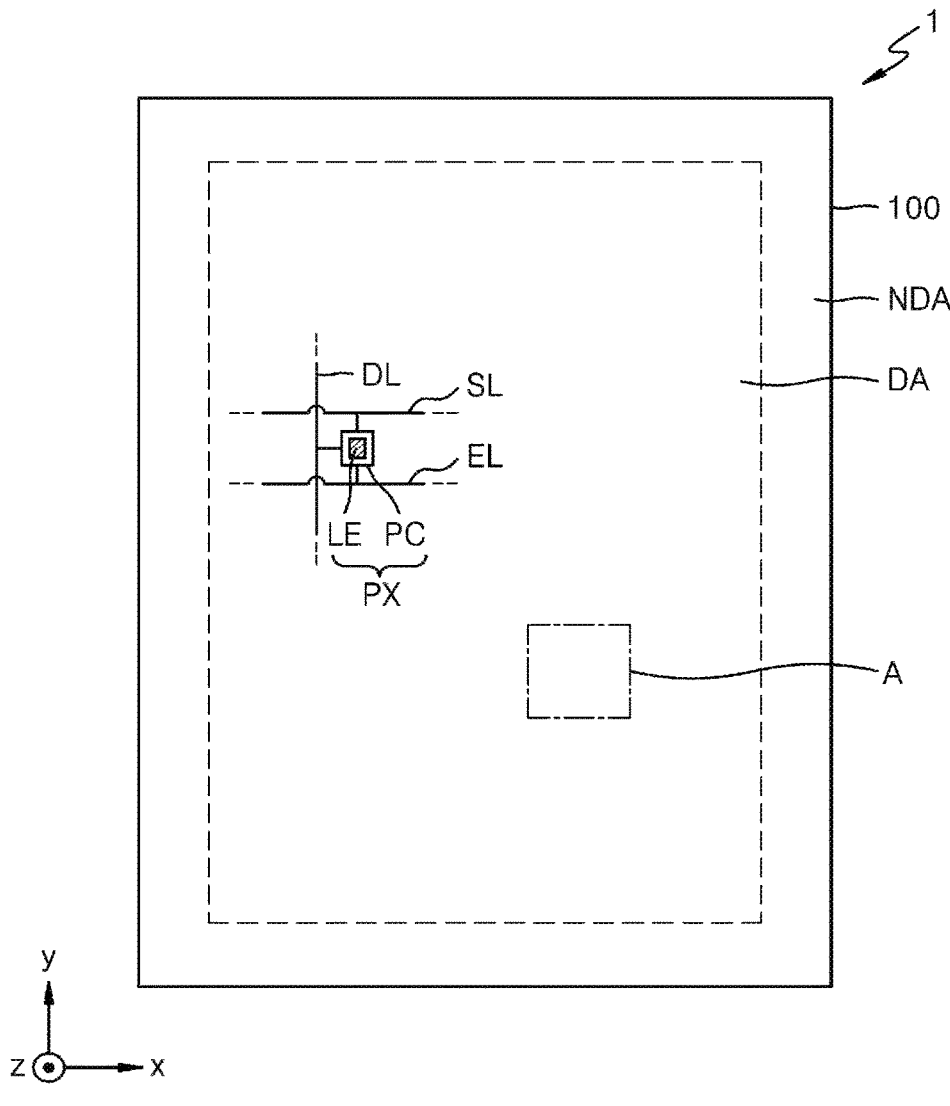
FIG. 3 is a plan view schematically showing a display device according to an embodiment.

FIG. 3 is a plan view schematically showing the display device 1 according to an embodiment.

Referring to FIG. 3, an embodiment of the display device 1 may include a substrate 100, a pixel PX, a scan line SL, and a data line DL. The display device 1 may include the display area DA and the non-display area NDA. According to an embodiment, the display area DA and the non-display area NDA may be defined in the substrate 100. In an embodiment, for example, the substrate 100 may include the display area DA and the non-display area NDA.

The pixel PX may be arranged in the display area DA. The non-display area NDA may be adjacent to the display area DA. According to an embodiment, the non-display area NDA may at least partially surround the display area DA. In an embodiment, for example, the non-display area NDA may entirely surround the display area DA in a plan view or when viewed in the third direction (for example, the z direction or −z direction). A driving circuit (not shown) configured to apply an electric signal to the pixel PX may be arranged in the non-display area NDA. The non-display area NDA may include a pad area. A pad may be arranged in the pad area.

The pixel PX may be arranged in the display area DA. According to an embodiment, a plurality of pixels PX may be arranged in the display area DA. Each pixel PX may include a pixel circuit PC and a light-emitting element LE.

The pixel circuit PC may be a circuit configured to control the light-emitting element LE. A plurality of pixel circuits PC may be arranged in the display area DA. The pixel circuit PC may include at least one transistor and at least one storage capacitor. The pixel circuit PC may be connected to the scan line SL and the data line DL.

The light-emitting element LE may be electrically connected to the pixel circuit PC. A plurality of light-emitting elements LE may be arranged in the display area DA. The light-emitting element LE may be an organic light-emitting diode including an organic emission layer. Alternatively, the light-emitting element LE may be a light-emitting diode (LED) including an inorganic emission layer. A size of the LED may be in micro-scale or nano-scale. In an embodiment, for example, the LED may be a micro LED. Alternatively, the LED may be a nanorod LED. The nanorod LED may include gallium nitride (GaN). According to an embodiment, a color conversion layer may be disposed on the nanorod LED. The color conversion layer may include quantum dots. Alternatively, the light-emitting element LE may be a quantum dot LED including a quantum dot emission layer. Hereinafter, for convenience of description, embodiments where the light-emitting element LE is an organic LED will be described in detail, but not being limited thereto.

The scan line SL may extend in the first direction (for example, the x direction or −x direction). According to an embodiment, the scan line SL may be connected to a scan driving circuit (not shown). The scan line SL may be connected to the pixel circuit PC. Accordingly, the scan line SL may be configured to receive a scan signal from the scan driving circuit and transmit the same to the pixel circuit PC.

The data line DL may extend in the second direction (for example, the y direction or −y direction). The data line DL may be connected to a data driving circuit (not shown). The data line DL may be connected to the pixel circuit PC. The data line DL may be configured to receive a data signal from the data driving circuit and transmit the same to the pixel circuit PC.

Figure 4:
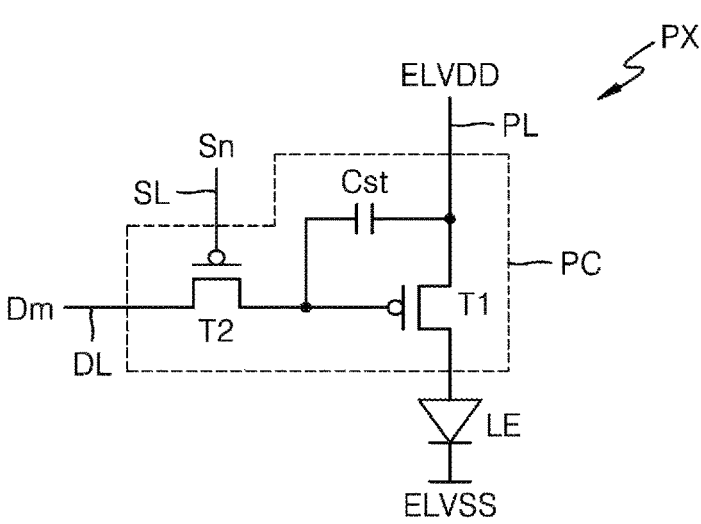
FIG. 4 is an equivalent circuit diagram schematically showing one pixel of a display device.

FIG. 4 is an equivalent circuit diagram schematically showing one pixel PX of a display device.

Referring to FIG. 4, an embodiment of the pixel PX may include the pixel circuit PC and the light-emitting element LE connected to the pixel circuit PC. According to an embodiment, the pixel circuit PC may include a driving transistor T1, a switching transistor T2, and a storage capacitor Cst.

The switching transistor T2 is connected to the scan line SL and the data line DL, and may be configured to transmit, to the driving transistor T1, a data signal Dm input from the data line DL in response to a scan signal Sn input from the scan line SL.

The storage capacitor Cst is connected to the switching transistor T2 and a driving voltage line PL, and may be configured to store a voltage corresponding to a difference between a voltage received from the switching transistor T2 and a first power voltage ELVDD supplied to the driving voltage line PL.

The driving transistor T1 is connected to the driving voltage line PL and the storage capacitor Cst, and may be configured to control a driving current flowing through the light-emitting element LE from the driving voltage line PL in response to a voltage stored in the storage capacitor Cst. The light-emitting element LE may be configured to emit a light of certain luminance corresponding to the driving current. An opposing electrode (for example, a cathode) of the light-emitting element LE may receive a second power voltage ELVSS.

In an embodiment, as shown in FIG. 4, the pixel circuit PC may include two transistors and one storage capacitor, but not being limited thereto. According to an alternative embodiment, the pixel circuit PC may include three or more transistors.

Figure 5:
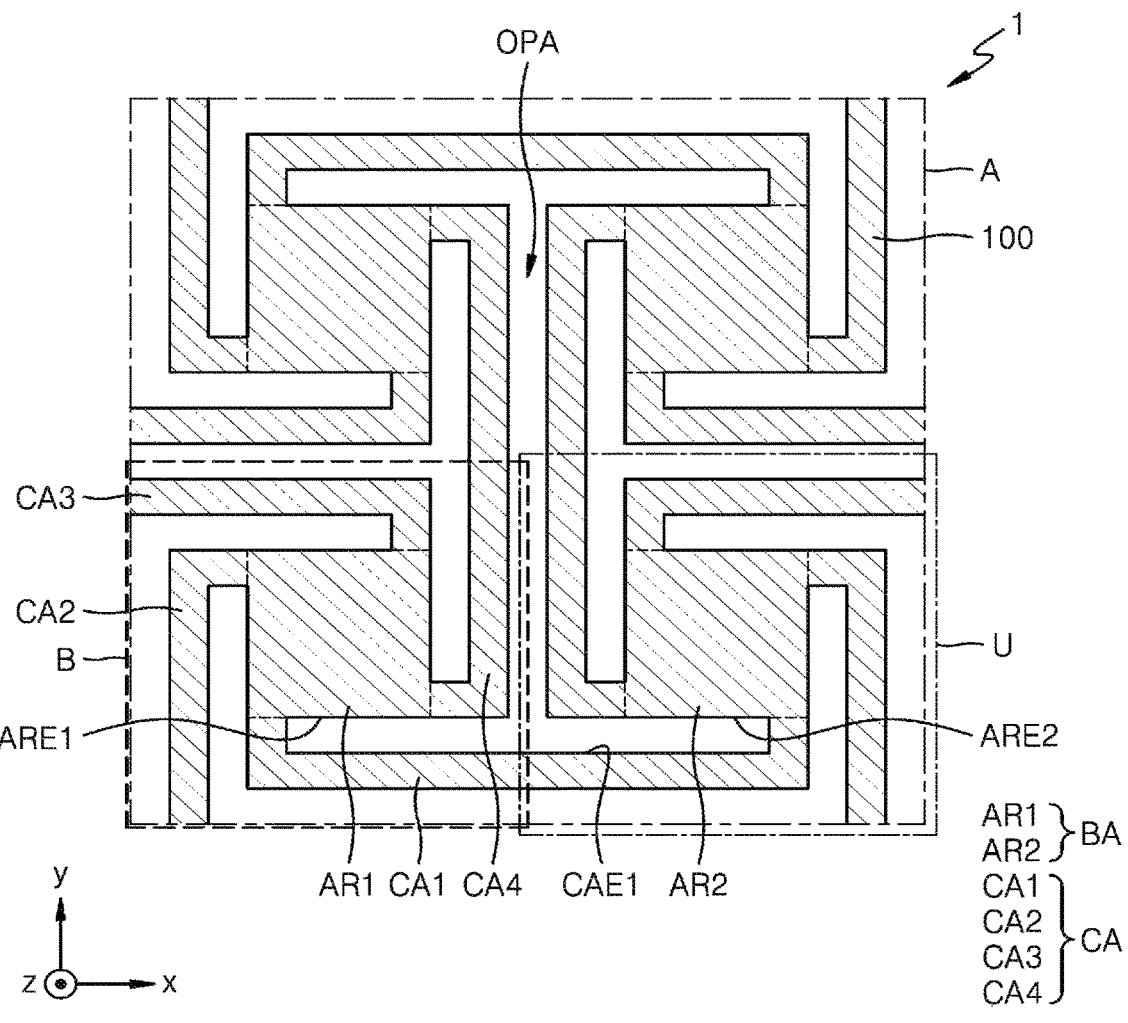
FIG. 5 is an enlarged view of a portion A of the display device of FIG. 3.

FIG. 5 is an enlarged view of a portion A of the display device 1 of FIG. 3.

Referring to FIG. 5, the display device 1 may include the substrate 100. The substrate 100 may include an opening area OPA. The opening area OPA may be an area where the substrate 100 is not arranged or an area defined by an opening defined or formed through the substrate 100. Accordingly, the display device 1 may extend or contract in any one of various shapes without damage. The substrate 100 may include a base area BA and a connection area CA.

A pixel may be arranged in the base area BA. There may be a plurality of base areas BA or the base area BA may be provided in plural. The plurality of base areas BA may be spaced apart from each other. According to an embodiment, the plurality of base areas BA may be spaced apart from each other in the first direction (for example, the x direction or −x direction) and/or the second direction (for example, the y direction or −y direction). According to an embodiment, the plurality of base areas BA may include a first area AR1 and a second area AR2.

The connection area CA may connect the adjacent base areas BA to each other. In an embodiment, where the adjacent base areas BA are connected to each other by the connection area CA, the connection area CA extends between the adjacent base areas BA, and the adjacent base areas BA and the connection area CA are integrally provided or formed with each other as a single unitary and indivisible part. There may be a plurality of connection areas CA or the connection area CA may be provided in plural. The connection area CA may be a bridge area.

An extending direction of the connection area CA may be changed. In an embodiment, for example, an extending direction of a first connection area CA1 may be changed from the second direction (for example, the y direction or −y direction) to the first direction (for example, the x direction or −x direction). An extending direction of a second connection area CA2 may be changed from the first direction (for example, the x direction or −x direction) to the second direction (for example, the y direction or −y direction). In an embodiment, as shown in FIG. 5, an edge of the connection area CA is bent at a right angle, but not being limited thereto. According to an alternative embodiment, the edge of the connection area CA may be bent at any one of various angles. According to another alternative embodiment, the edge of the connection area CA may be curved.

One base area BA may be connected to four connection areas CA. Four connection areas CA connected to one base area BA may extend in different directions from each other, and each connection area CA may be connected to another base area BA arranged adjacent to the one base area BA. In an embodiment, for example, the first area AR1 may be connected to the first connection area CA1, the second connection area CA2, a third connection area CA3, and a fourth connection area CA4. The first connection area CA1, the second connection area CA2, the third connection area CA3, and the fourth connection area CA4 may extend from the first area AR1. The first connection area CA1 may extend from the first area AR1 to the second area AR2. Accordingly, the first area AR1, the first connection area CA1, and the second area AR2 may be connected to each other and integrally provided or formed with each other as a single unitary and indivisible part.

The opening area OPA may be arranged between the adjacent base areas BA. In an embodiment, for example, the opening area OPA may be arranged between the first area AR1 and the second area AR2. At least a portion of the opening area OPA may be defined by an edge ARE1 of the first area AR1, an edge CAE1 of the first connection area CA1, and an edge ARE2 of the second area AR2, in a plan view.

One base area BA and some of connection areas CA extending therefrom may collectively define one base unit U. The base unit U may be repeatedly arranged in the first direction (for example, the x direction or −x direction) and/or the second direction (for example, the y direction or −y direction). It may be understood that the display device 1 is provided as the repeatedly arranged base units U are connected to each other. Two adjacent base units U may be symmetric with each other. In an embodiment, for example, two base units U adjacent in the first direction (for example, the x direction or −x direction) may be bilaterally symmetric based on an axis of symmetry located between the two base units U and extending in the second direction (for example, the y direction or −y direction). In such an embodiment, two base units U adjacent in the second direction (for example, the y direction or −y direction) may be vertically symmetric based on an axis of symmetry located between the two base units U and extending in the first direction (for example, the x direction or −x direction).

Figure 6A:
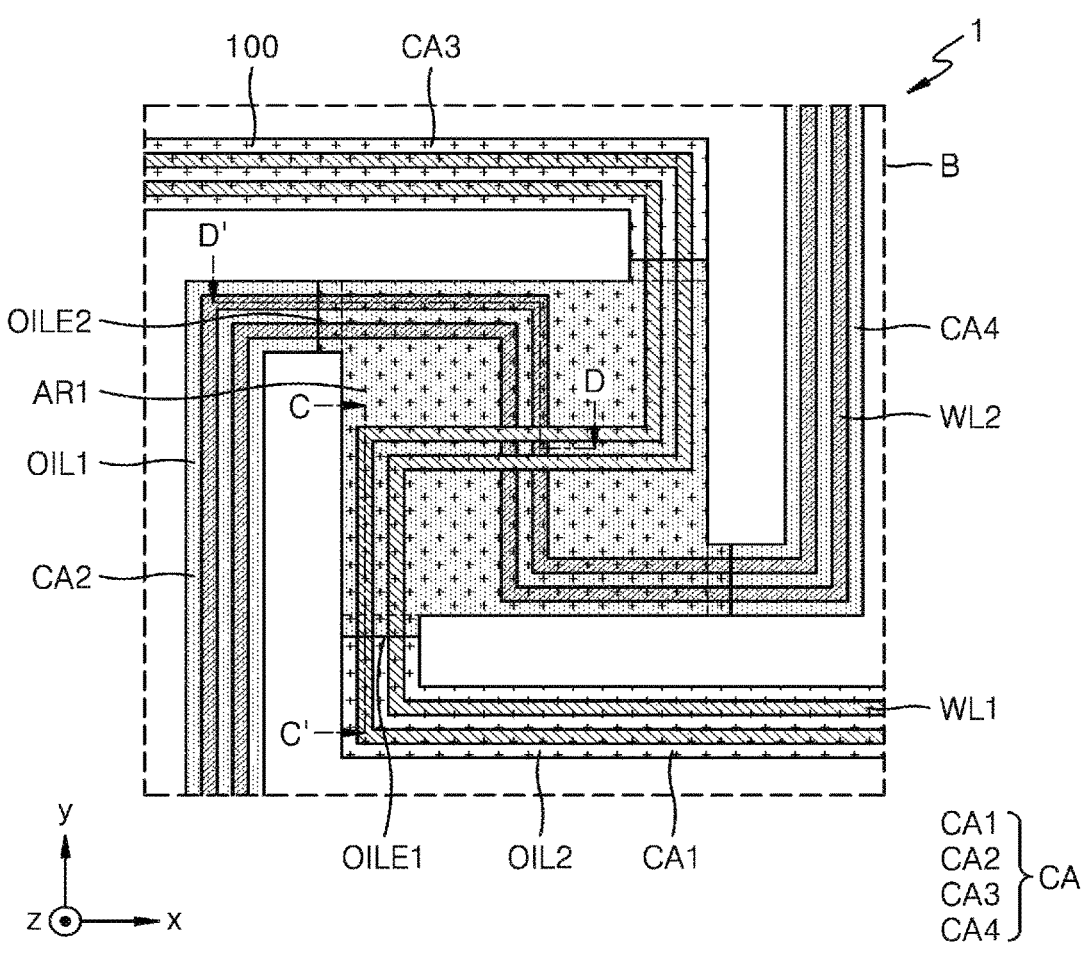
FIG. 6A is an enlarged view of a portion B of the display device of FIG. 5, according to an embodiment.
Figure 6B:
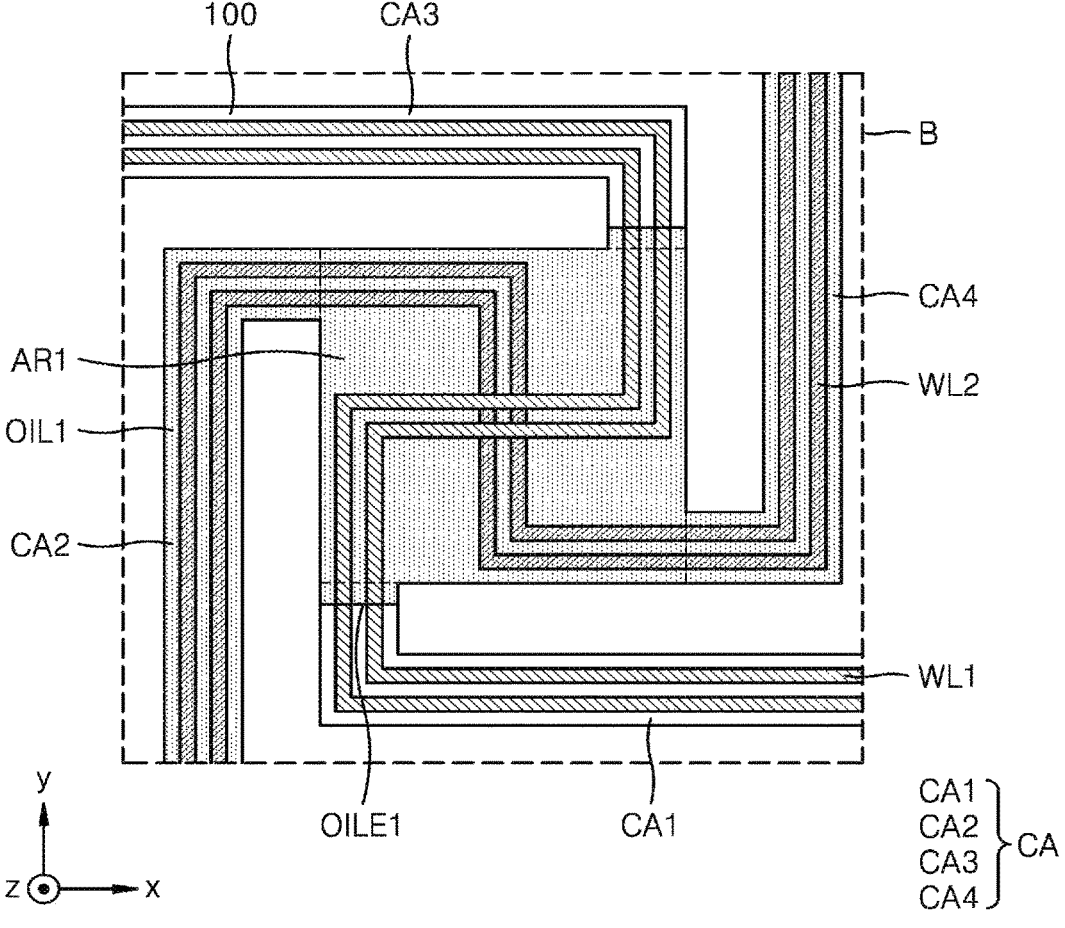
FIGS. 6B and 6C are each a plan view showing some of components of FIG. 6A.
Figure 6C:
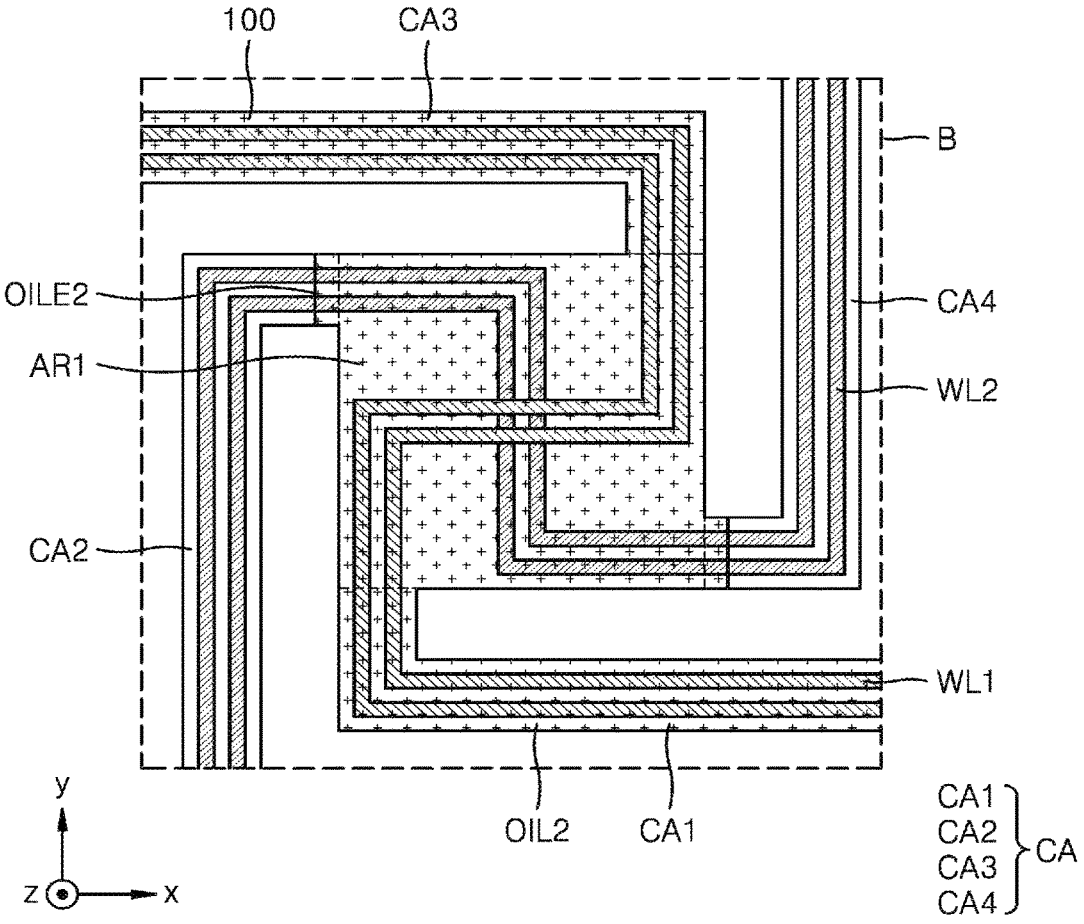

FIG. 6A is an enlarged view of a portion B of the display device 1 of FIG. 5, according to an embodiment. FIGS. 6B and 6C are each a plan view showing some of components of FIG. 6A. In FIGS. 6A through 6C, like reference numerals as FIG. 5 denote like elements, and any repetitive detailed descriptions thereof will be omitted or simplified.

Referring to FIGS. 6A through 6C, an embodiment of the display device 1 may include the substrate 100, a first organic insulating layer OIL1, a second organic insulating layer OIL2, a first wire WL1, and a second wire WL2. FIG. 6B illustrates the substrate 100, the first organic insulating layer OIL1, the first wire WL1, and the second wire WL2, and FIG. 6C illustrates the substrate 100, the second organic insulating layer OIL2, the first wire WL1, and the second wire WL2.

The substrate 100 may include the first area AR1 and the connection area CA. The connection area CA may extend from the first area AR1. According to an embodiment, the connection area CA may include the first connection area CA1, the second connection area CA2, the third connection area CA3, and the fourth connection area CA4. The first connection area CA1, the second connection area CA2, the third connection area CA3, and the fourth connection area CA4 may each extend from the first area AR1. In FIGS. 6A through 6C, the extending directions of the first connection area CA1 and the third connection area CA3 are changed from the first direction (for example, the x direction or −x direction) to the second direction (for example, the y direction or −y direction), so that the first connection area CA1 and the third connection area CA3 are connected to the first area AR1 at an end thereof, but the first connection area CA1 and the third connection area CA3 may extend substantially in the first direction (for example, the x direction or −x direction). In FIGS. 6A through 6C, the extending directions of the second connection area CA2 and the fourth connection area CA4 are changed from the second direction (for example, the y direction or −y direction) to the first direction (for example, the x direction or −x direction), so that the second connection area CA2 and the fourth connection area CA4 connected to the first area AR1 at an end thereof, but the second connection area CA2 and the fourth connection area CA4 may extend substantially in the second direction (for example, the y direction or −y direction).

The first organic insulating layer OIL1 may be disposed on the substrate 100. According to some embodiments, the first organic insulating layer OIL1 may be a first planarization layer. The first organic insulating layer OIL1 may extend along the second connection area CA2, the first area AR1, and the fourth connection area CA4. The first organic insulating layer OIL1 may continuously extend in the second connection area CA2, the first area AR1, and the fourth connection area CA4. The first organic insulating layer OIL1 may include a first edge OILE1. The first edge OILE1 may match or correspond to (e.g., aligned with) each of an edge of the first connection area CA1 and an edge of the third connection area CA3. The first edge OILE1 may extend to cross the first connection area CA1 or to overlap a portion of the first connection area CA1 adjacent to a boundary thereof with the first area AR1. In such an embodiment, the first organic insulating layer OIL1 may not extend along the first connection area CA1 in a plan view. The first edge OILE1 may extend to cross the third connection area CA3 or to overlap a portion of the third connection area CA3 adjacent to a boundary thereof with the first area AR1. In such an embodiment, the first organic insulating layer OIL1 may not extend along the third connection area CA3 in a plan view. The first organic insulating layer OIL1 may include an organic material.

The second organic insulating layer OIL2 may be disposed on the first organic insulating layer OIL1 in the first area AR1. According to some embodiments, the second organic insulating layer OIL2 may be a second planarization layer. The second organic insulating layer OIL2 may extend from the first area AR1 to each of the first connection area CA1 and the third connection area CA3. The second organic insulating layer OIL2 may continuously extend in the first connection area CA1, the first area AR1, and the third connection area CA3. The second organic insulating layer OIL2 may include a second edge OILE2. The second edge OILE2 may match or correspond to (e.g., aligned with) each of an edge of the second connection area CA2 and an edge of the fourth connection area CA4. The second edge OILE2 may extend to cross the second connection area CA2 or to overlap a portion of the second connection area CA2 adjacent to a boundary thereof with the first area AR1. In such an embodiment, the second organic insulating layer OIL2 may not extend along the second connection area CA2 in a plan view. The second edge OILE2 may extend to cross the fourth connection area CA4 or to overlap a portion of the fourth connection area CA4 adjacent to a boundary thereof with the first area AR1. In such an embodiment, the second organic insulating layer OIL2 may not extend along the fourth connection area CA4 in a plan view. The second organic insulating layer OIL2 may include an organic material.

The first organic insulating layer OIL1 may extend to the second connection area CA2 across the second edge OILE2 in a plan view. The first organic insulating layer OIL1 may extend to the fourth connection area CA4 across the second edge OILE2 in a plan view. The second organic insulating layer OIL2 may extend to the first connection area CA1 across the first edge OILE1 in a plan view. The second organic insulating layer OIL2 may extend to the third connection area CA3 across the first edge OILE1 in a plan view. Accordingly, any one of the first organic insulating layer OIL1 and the second organic insulating layer OIL2 may be arranged in the connection area CA.

The first wire WL1 may be arranged between the first organic insulating layer OIL1 and the second organic insulating layer OIL2, in the first area AR1. The first wire WL1 may extend from the first area AR1 to each of the first connection area CA1 and the third connection area CA3. The first wire WL1 may continuously extend in the first connection area CA1, the first area AR1, and the third connection area CA3. According to some embodiments, there may be a plurality of first wires WL1. According to an embodiment, the first wire WL1 may be a voltage line configured to transmit a power voltage. In an embodiment, for example, the first wire WL1 may be the driving voltage line PL configured to transmit the first power voltage ELVDD of FIG. 4. According to an alternative embodiment, the first wire WL1 may be a signal line. In an embodiment, for example, the first wire WL1 may be the scan line SL or data line DL of FIG. 4.

The second wire WL2 may be arranged between the substrate 100 and the first organic insulating layer OIL1, in the first area AR1. The second wire WL2 may extend from the first area AR1 to each of the second connection area CA2 and the fourth connection area CA4. The second wire WL2 may continuously extend in the second connection area CA2, the first area AR1, and the fourth connection area CA4. According to some embodiments, there may be a plurality of second wires WL2. According to an embodiment, the second wire WL2 may be a voltage line configured to transmit a power voltage. In an embodiment, for example, the second wire WL2 may be the driving voltage line PL configured to transmit the first power voltage ELVDD of FIG. 4. According to an alternative embodiment, the second wire WL2 may be a signal line. In an embodiment, for example, the second wire WL2 may be the scan line SL or data line DL of FIG. 4.

The first wire WL1 and the second wire WL2 may cross each other in a plan view. According to some embodiments, a contact hole may be defined or formed through the first organic insulating layer OIL1 in the first area AR1, and the first wire WL1 and the second wire WL2 may be connected to each other through the contact hole.

According to an embodiment, the first wire WL1 and the second wire WL2 may include a same material as each other. According to an alternative embodiment, the first wire WL1 and the second wire WL2 may include different materials from each other.

According to an embodiment, as shown in FIGS. 6A to 6C, the first wire WL1 and the second wire WL2 may be arranged in or directly on different layers from each other, in the first area AR1. In an embodiment, for example, the first wire WL1 may be arranged between the first organic insulating layer OIL1 and the second organic insulating layer OIL2, and the second wire WL2 may be arranged between the substrate 100 and the first organic insulating layer OIL1. Accordingly, wires may be variously arranged in the first area AR1. The first wire WL1 may be arranged between the substrate 100 and the second organic insulating layer OIL2, in the connection area CA. The second wire WL2 may be arranged between the substrate 100 and the first organic insulating layer OIL1, in the connection area CA. A portion of the connection area CA may move in the third direction (for example, the z direction or −z direction) when the display device 1 extends or contracts. In this case, it may be desired that the first wire WL1 and the second wire WL2 are located in a stress neutral plane in the display device 1. In an embodiment, the first wire WL1 and the second wire WL2 may be arranged in different layers in the first area AR1, and may each be located in the stress neutral plane in the connection area CA. Accordingly, stress applied to the first wire WL1 and second wire WL2 may be reduced.

Figure 7:
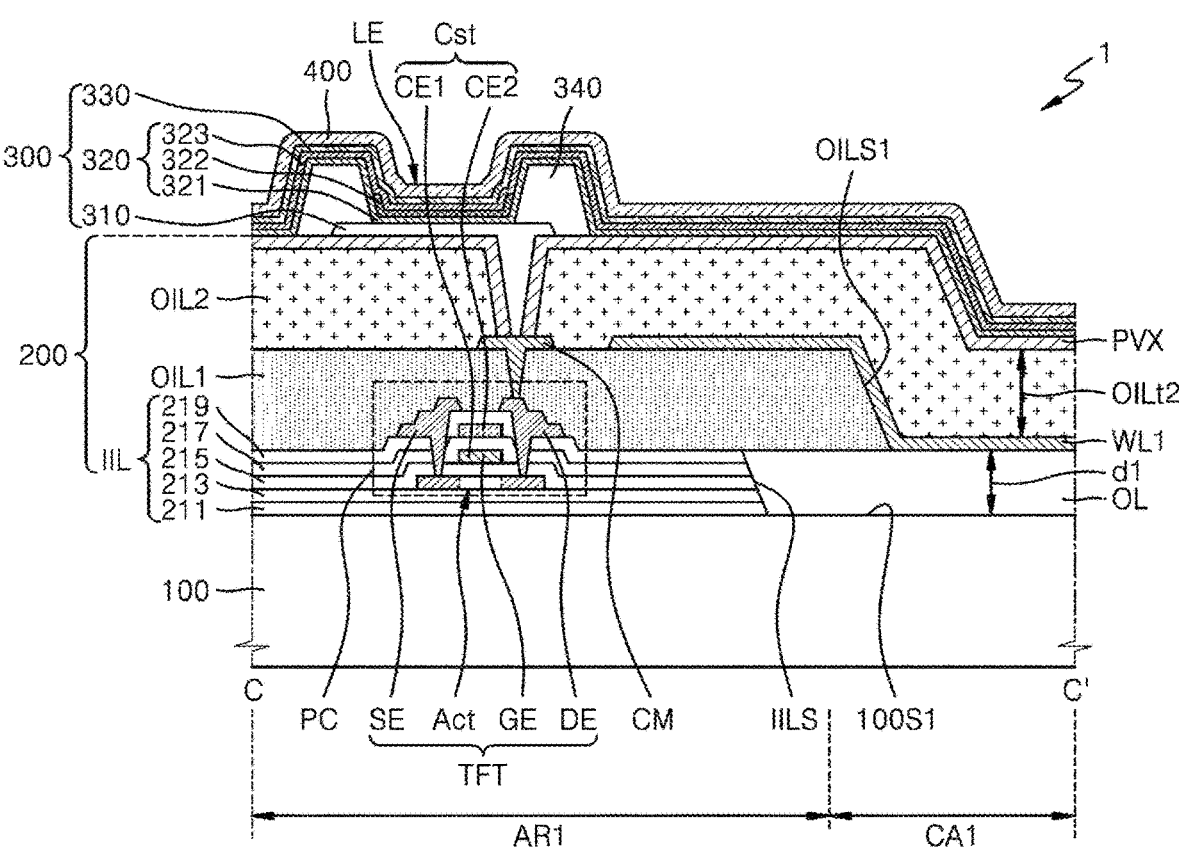
FIG. 7 is a cross-sectional view schematically showing the display device, taken along line C-C' of FIG. 6A.
Figure 8:
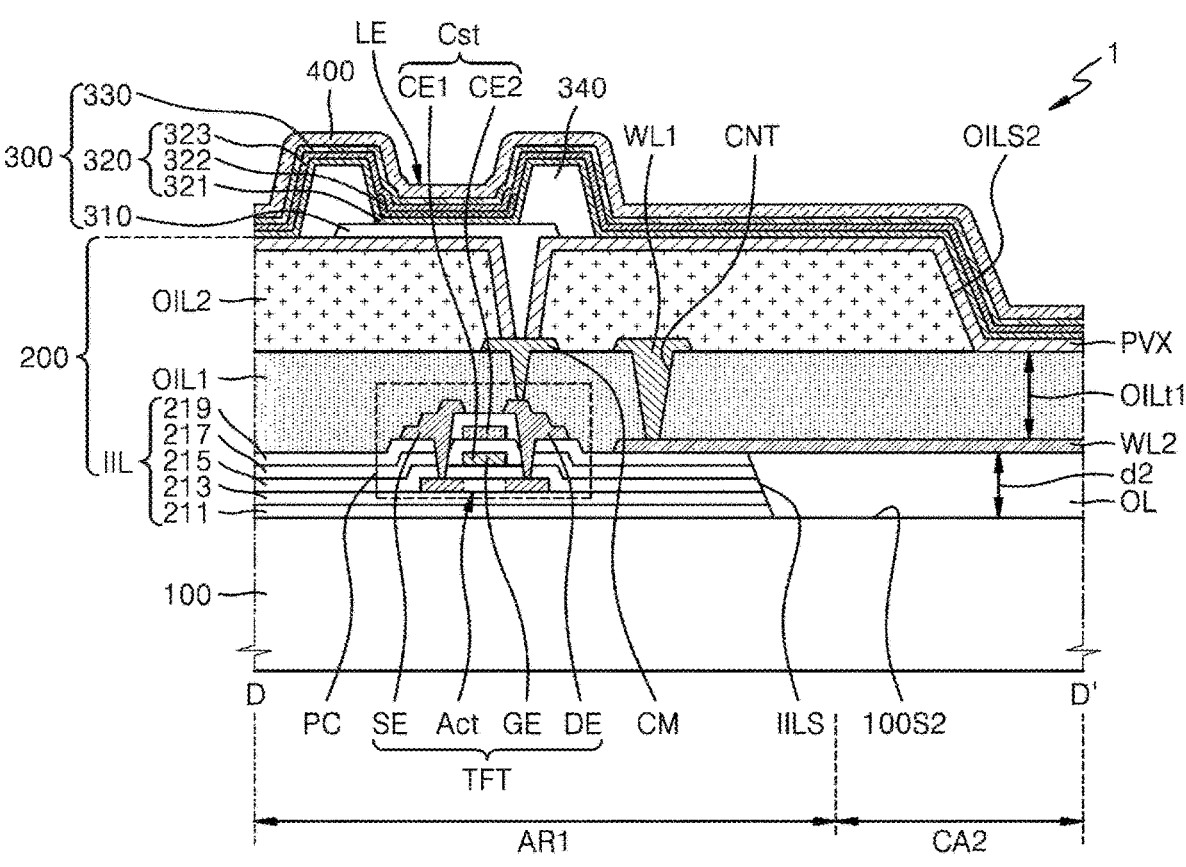
FIG. 8 is a cross-sectional view schematically showing the display device, taken along line D-D' of FIG. 6A.

FIG. 7 is a cross-sectional view schematically showing the display device 1, taken along line C-C' of FIG. 6A. FIG. 8 is a cross-sectional view schematically showing the display device 1, taken along line D-D' of FIG. 6A.

Referring to FIG. 7, an embodiment of the display device 1 may include the substrate 100, a circuit layer 200, a light-emitting element layer 300, and an inorganic encapsulation layer 400. The substrate 100 may include the first area AR1 and the first connection area CA1. The first connection area CA1 may extend from the first area AR1. The substrate 100 may include a polymer resin, such as polyether sulfone, polyarylate, polyetherimide, polyethylene naphthalate, polyethylene terephthalate, polyphenylene sulfide, polyimide, polycarbonate, cellulose triacetate, or cellulose acetate propionate. According to an embodiment, the substrate 100 may have a multilayer structure including a base layer including the polymer resin described above and a barrier layer (not shown). The substrate 100 including the polymer resin may be flexible, rollable, or bendable. According to some embodiment, the substrate 100 may include glass.

The circuit layer 200 may be disposed on the substrate 100. The circuit layer 200 may include the pixel circuit PC, an inorganic insulating layer IIL, an organic layer OL, the first organic insulating layer OIL1, the first wire WL1, a connection electrode CM, the second organic insulating layer OIL2, and an inorganic layer PVX. The pixel circuit PC may include a transistor TFT and the storage capacitor Cst. The transistor TFT may include a semiconductor layer Act, a gate electrode GE, a source electrode SE, and a drain electrode DE. The storage capacitor Cst may include a first capacitor electrode CE1 and a second capacitor electrode CE2.

The inorganic insulating layer IIL may be disposed on the substrate 100 in the first area AR1. The inorganic insulating layer IIL may include a barrier layer 211, a buffer layer 213, a first gate insulating layer 215, a second gate insulating layer 217, and an interlayer insulating layer 219.

The barrier layer 211 may be disposed on the substrate 100. The barrier layer 211 may be a layer preventing or reducing penetration of a foreign material. The barrier layer 211 may be a single layer or multilayer including an inorganic material, such as silicon nitride ($SiN_x$), silicon oxide ($SiO_2$), and/or silicon oxynitride (SiON).

The buffer layer 213 may be disposed on the barrier layer 211. The buffer layer 213 may include an inorganic insulating material, such as $SiN_x$, SiON, or $SiO_2$, and may be a single layer or multilayer including the inorganic insulating material.

The semiconductor layer Act may be disposed on the buffer layer 213. The semiconductor layer Act may include polysilicon. Alternatively, the semiconductor layer Act may include amorphous silicon, an oxide semiconductor, or an organic semiconductor. According to an embodiment, the semiconductor layer Act may include a channel region, and a source region and a drain region respectively arranged on opposing sides of the channel region.

The first gate insulating layer 215 may be disposed on the semiconductor layer Act and the buffer layer 213. The first gate insulating layer 215 may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), or zinc oxide ($ZnO_x$). $ZnO_x$ may be zinc oxide (ZnO) and/or zinc peroxide ($ZnO_2$).

The gate electrode GE may be disposed on the first gate insulating layer 215. The gate electrode GE may overlap the channel region of the semiconductor layer Act. The gate electrode GE may include a low-resistance metal material. According to an embodiment, the gate electrode GE may include a conductive material including molybdenum (Mo), aluminum (Al), copper (Cu), or titanium (Ti), and may include a multilayer or single layer including the conductive material.

The second gate insulating layer 217 may be disposed on the gate electrode GE and the first gate insulating layer 215. The second gate insulating layer 217 may include an inorganic insulating material, such as $SiO_2$, $SiN_x$, SiON, $Al_2O_3$, $TiO_2$, $Ta_2O_5$, $HfO_2$, or $ZnO_x$.

The second capacitor electrode CE2 may be disposed on the second gate insulating layer 217. The second capacitor electrode CE2 may overlap the gate electrode GE. In such an embodiment, the gate electrode GE may function as the first capacitor electrode CE1. In an embodiment, as shown in FIG. 7, the storage capacitor Cst and the transistor TFT overlap each other, but not being limited thereto. According to an alternative embodiment, the storage capacitor Cst and the transistor TFT may not overlap each other. In such an embodiment, the first capacitor electrode CE1 and the gate electrode GE may be separate electrodes. The second capacitor electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multilayer including such a material.

The interlayer insulating layer 219 may be disposed on the second capacitor electrode CE2 and the second gate insulating layer 217. The interlayer insulating layer 219 may include an inorganic insulating material, such as $SiO_2$, $SiN_x$, SiON, $Al_2O_3$, $TiO_2$, $Ta_2O_5$, $HfO_2$, or $ZnO_x$.

The source electrode SE and the drain electrode DE may each be disposed on the interlayer insulating layer 219. The source electrode SE and the drain electrode DE may each be connected to the semiconductor layer Act through a contact hole provided or defined in the first gate insulating layer 215, the second gate insulating layer 217, and the interlayer insulating layer 219. At least one selected from the source electrode SE and the drain electrode DE may include a conductive material including Mo, Al, Cu, or Ti, and may be provided in a multilayer or single layer including the conductive material. According to an embodiment, at least one selected from the source electrode SE and the drain electrode DE may have a multilayer structure of Ti/Al/Ti.

The inorganic insulating layer IIL may be arranged in the first area AR1 and not arranged in the first connection area CA1. The inorganic insulating layer IIL may include a side surface IILS. The side surface IILS of the inorganic insulating layer IIL may be a surface inclined with respect to a top surface of the substrate 100 or a surface extending in a direction crossing the top surface of the substrate 100. The side surface IILS of the inorganic insulating layer IIL may be arranged to face the first connection area CA1. In such an embodiment where the inorganic insulating layer IIL is not arranged in the first connection area CA1, the display device 1 may be flexible in the first connection area CA1. In an embodiment, as shown in FIG. 7, the inorganic insulating layer IIL does not include a stepped portion, but not being limited thereto. According to an alternative embodiment, the inorganic insulating layer IIL may include a stepped portion.

The organic layer OL may be arranged in the first connection area CA1. According to some embodiments, the organic layer OL may be a lower planarization layer. The organic layer OL may cover the side surface IILS of the inorganic insulating layer IIL. The organic layer OL may include an organic material. The organic layer OL may include an organic insulating material, such as a general-purpose polymer, for example, polymethylmethacrylate (PMMA) or polystyrene (PS), a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof.

The first organic insulating layer OIL1 may be disposed on the inorganic insulating layer IIL in the first area AR1. The first organic insulating layer OIL1 may include a first side surface OILS1. The first side surface OILS1 may be a surface inclined with respect to the top surface of the substrate 100 or a surface extending in a direction crossing the top surface of the substrate 100. The first side surface OILS1 may be arranged to face the first connection area CA1. The first side surface OILS1 may be a first edge of the first organic insulating layer OIL1. The first organic insulating layer OIL1 may include an organic material. The first organic insulating layer OIL1 may include an organic insulating material, such as a general-purpose polymer, for example, PMMA or PS, a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof.

The first wire WL1 may be disposed on the first organic insulating layer OIL1 in the first area AR1. The first wire WL1 may be disposed on the organic layer OL in the first connection area CA1. The first wire WL1 may extend along the first side surface OILS1 in a direction from the first area AR1 to the first connection area CA1. According to some embodiments, the first wire WL1 may be connected to the pixel circuit PC. The first wire WL1 may include a conductive material including Mo, Al, Cu, or Ti, and may be a multilayer or single layer including the conductive material. According to an embodiment, the first wire WL1 may have a multilayer structure of Ti/Al/Ti.

The connection electrode CM may be disposed on the first organic insulating layer OIL1 in the first area AR1. The connection electrode CM may be electrically connected to the pixel circuit PC through a hole defined in the first organic insulating layer OIL1, in the first area AR1. The connection electrode CM may include a conductive material including Mo, Al, Cu, or Ti, and may be a multilayer or single layer including the conductive material. The connection electrode CM may have a multilayer structure of Ti/Al/Ti.

The second organic insulating layer OIL2 may be disposed on the first wire WL1, the connection electrode CM, the first organic insulating layer OIL1, and the organic layer OL. The first wire WL1 may be arranged between the organic layer OL and the second organic insulating layer OIL2, in the first connection area CA1. The second organic insulating layer OIL2 may extend from the first area AR1 to the first connection area CA1. The second organic insulating layer OIL2 may extend along the first side surface OILS1 in a direction from the first area AR1 to the first connection area CA1. The second organic insulating layer OIL2 may include an organic material. The second organic insulating layer OIL2 may include an organic insulating material, such as a general-purpose polymer, for example, PMMA or PS, a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof.

The second organic insulating layer OIL2 may be disposed on the first wire WL1. In such an embodiment, the second organic insulating layer OIL2 may prevent or reduce damage to the first wire WL1 during a manufacturing process.

According to an embodiment, the first organic insulating layer OIL1 and the second organic insulating layer OIL2 may include a same material as each other. According to an alternative embodiment, the first organic insulating layer OIL1 and the second organic insulating layer OIL2 may include different materials from each other.

The inorganic layer PVX may be disposed on the second organic insulating layer OIL2. The inorganic layer PVX may include an inorganic material.

The light-emitting element layer 300 may be disposed on the circuit layer 200. The light-emitting element layer 300 may include a light-emitting element LE and a pixel-defining layer 340. The light-emitting element LE may be an organic LED. The light-emitting element LE may be disposed on the second organic insulating layer OIL2. The light-emitting element LE may include a pixel electrode 310, an intermediate layer 320, and an opposing electrode 330.

The pixel electrode 310 may be connected to the connection electrode CM through a hole defined in the second organic insulating layer OIL2. Accordingly, the light-emitting element LE may be connected to the pixel circuit PC. The pixel electrode 310 may include a conducting oxide, such as indium tin oxide (ITO), indium zinc oxide (IZO), ZnO, indium oxide ($In_2O_3$), indium gallium oxide (IGO), or aluminum zinc oxide (AZO). According to an alternative embodiment, the pixel electrode 310 may include a reflective layer including Ag, Mg, Al, Pt, Pd, Au, Ni, Nd, Ir, Cr, or a compound thereof. According to another alternative embodiment, the pixel electrode 310 may further include a layer formed of ITO, IZO, ZnO, or $In_2O_3$, on/below the reflective layer.

The pixel-defining layer 340 may cover an edge of the pixel electrode 310, a pixel opening portion is defined in the pixel-defining layer 340, and the pixel opening portion may overlap the pixel electrode 310. The pixel opening portion may define an emission region of light emitted from the light-emitting element LE. The pixel-defining layer 340 may include an organic insulating material and/or an inorganic insulating material. According to some embodiments, the pixel-defining layer 340 may include a light-blocking material.

The intermediate layer 320 may be disposed on the pixel electrode 310, the pixel-defining layer 340, and/or the inorganic layer PVX. The intermediate layer 320 may include an emission layer 322. The emission layer 322 may overlap the pixel electrode 310. The emission layer 322 may include a high-molecular weight organic material or low-molecular weight organic material, which emit light of a certain color.

The intermediate layer 320 may further include at least one selected from a first functional layer 321 and a second functional layer 323. The first functional layer 321 may be arranged between the pixel electrode 310 and the emission layer 322. The first functional layer 321 may include a hole transport layer (HTL) and/or a hole injection layer (HIL). The second functional layer 323 may be arranged between the emission layer 322 and the opposing electrode 330. The second functional layer 323 may include an electron transport layer (ETL) and/or an electron injection layer (EIL). According to an embodiment, the first functional layer 321 and the second functional layer 323 may be disposed entirely on the substrate 100.

The opposing electrode 330 may be disposed on the pixel electrode 310, the intermediate layer 320, and the pixel-defining layer 340. The opposing electrode 330 may include a conductive material with a low work function. In an embodiment, for example, the opposing electrode 330 may include a (semi-)transparent layer including Ag, Mg, Al, Pt, Pd, Au, Ni, Nd, Ir, Cr, lithium (Li), Ca, or an alloy thereof. The opposing electrode 330 may further include a layer including ITO, IZO, ZnO, or $In_2O_3$, on the (semi-)transparent layer including the above material.

The inorganic encapsulation layer 400 may be disposed on the light-emitting element layer 300. The inorganic encapsulation layer 400 may be disposed on the first area AR1 and the first connection area CA1 continuously and entirely. Accordingly, introduction of moisture or oxygen into the light-emitting element LE from the outside may be prevented or reduced. According to some embodiments, an organic encapsulation layer may be disposed on the inorganic encapsulation layer 400 to overlap the light-emitting element LE. The organic encapsulation layer may include an organic material. In an embodiment, an additional inorganic encapsulation layer may be further disposed on the organic encapsulation layer.

Although not illustrated, a touch sensor layer and an optical functional layer may be further disposed on the inorganic encapsulation layer 400. The touch sensor layer may be disposed on the inorganic encapsulation layer 400. The touch sensor layer may sense coordinate information according to an external input, for example, a touch event. The touch sensor layer may include a sensor electrode and touch wires connected to the sensor electrode. The touch sensor layer may detect the external input via a magnetic capacitance method or a mutual capacitance method.

The optical functional layer may be disposed on the touch sensor layer. The optical functional layer may reduce reflectance of light (for example, external light) incident from the outside towards the display device 1. The optical functional layer may improve color purity of light emitted from the display device 1. According to an embodiment, the optical functional layer may include a retarder and a polarizer. The retarder may be a film type or liquid crystal coating type, and may include a λ/2 retarder and/or a λ/4 retarder. The polarizer may also be a film type or a liquid crystal coating type. The film type may include an elongated synthetic resin film, and the liquid crystal coating type may include liquid crystals arranged in a certain arrangement. The retarder and the polarizer may further include a protection film.

According to an alternative embodiment, the optical functional layer may include a black matrix and color filters. The color filters may be arranged considering colors of lights respectively emitted from a plurality of pixels of the display device 1. The color filters may each include red, green, or blue pigment or dye. Alternatively, the color filters may each further include quantum dots, in addition to the above pigment or dye. Alternatively, some of the color filters may not include the pigment or dye, and may include scattered particles, such as titanium oxide.

According to another alternative embodiment, the optical functional layer may include a destructive interference structure. The destructive interference structure may include a first reflective layer and a second reflective layer arranged on different layers. First reflective light and second reflective light reflected respectively from the first reflective layer and the second reflective layer may destructively interfere, and accordingly, reflectance of external light may be reduced.

Referring to FIG. 8, the display device 1 may include the substrate 100, the circuit layer 200, the light-emitting element layer 300, and the inorganic encapsulation layer 400. The substrate 100 may include the first area AR1 and the second connection area CA2. The second connection area CA2 may extend from the first area AR1.

The circuit layer 200 may be disposed on the substrate 100. The circuit layer 200 may include the pixel circuit PC, the inorganic insulating layer IIL, the organic layer OL, the second wire WL2, the first organic insulating layer OIL1, the first wire WL1, the connection electrode CM, the second organic insulating layer OIL2, and the inorganic layer PVX.

The inorganic insulating layer IIL may be arranged in the first area AR1 and not arranged in the second connection area CA2. The inorganic insulating layer IIL may include the side surface IILS. The side surface IILS of the inorganic insulating layer IIL may be arranged to face the second connection area CA2. In such an embodiment, the inorganic insulating layer IIL is not arranged in the second connection area CA2, such that the display device 1 may be flexible in the second connection area CA2.

The organic layer OL may be arranged in the second connection area CA2. The organic layer OL may cover the side surface IILS of the inorganic insulating layer IIL.

The second wire WL2 may be disposed on the inorganic insulating layer IIL in the first area AR1. The second wire WL2 may be disposed on the organic layer OL in the second connection area CA2. The second wire WL2 may include a conductive material including Mo, Al, Cu, or Ti, and may be a multilayer or single layer including the conductive material. According to an embodiment, the second wire WL2 may have a multilayer structure of Ti/Al/Ti.

The first organic insulating layer OIL1 may be disposed on the inorganic insulating layer IIL in the first area AR1. The first organic insulating layer OIL1 may extend from the first area AR1 to the second connection area CA2. The second wire WL2 may be arranged between the organic layer OL and the first organic insulating layer OIL1, in the second connection area CA2.

The first wire WL1 may be disposed on the first organic insulating layer OIL1 in the first area AR1. According to some embodiments, a contact hole CNT is defined through the first organic insulating layer OIL1 in the first area AR1. The first wire WL1 and the second wire WL2 may be connected to each other through the contact hole CNT of the first organic insulating layer OIL1.

The first organic insulating layer OIL1 may be disposed on the second wire WL2. If the first organic insulating layer OIL1 is omitted, the second wire WL2 may be damaged while forming the first wire WL1. In an embodiment, the first organic insulating layer OIL1 is disposed on the second wire WL2 and the first wire WL1 is disposed on the first organic insulating layer OIL1, and thus, the second wire WL2 may not be damaged.

According to an embodiment, the first wire WL1 and the second wire WL2 may include a same material as each other. According to an alternative embodiment, the first wire WL1 and the second wire WL2 may include different materials from each other.

The second organic insulating layer OIL2 may be disposed on the first wire WL1, the connection electrode CM, and the first organic insulating layer OIL1. The second organic insulating layer OIL2 may include a second side surface OILS2. The second side surface OILS2 may be a surface inclined with respect to the top surface of the substrate 100 or a surface extending in a direction crossing the top surface of the substrate 100. The second organic insulating layer OIL2 may be arranged to face the second connection area CA2. The second side surface OILS2 may be a second edge of the second organic insulating layer OIL2. According to an embodiment, the first organic insulating layer OIL1 may extend in a direction from the second side surface OILS2 to the second connection area CA2.

In the first area AR1, the first organic insulating layer OIL1 and the second organic insulating layer OIL2 may be disposed on the second wire WL2, and in the second connection area CA2, only the first organic insulating layer OIL1 may be disposed on the second wire WL2. In such an embodiment, a thickness of the organic insulating layer may be different in the first area AR1 and the second connection area CA2.

Referring to FIGS. 7 and 8, a thickness OILt2 of the second organic insulating layer OIL2 in the first connection area CA1 and a thickness OILt1 of the first organic insulating layer OIL1 in the second connection area CA2 may be the same as each other. The thickness OILt2 of the second organic insulating layer OIL2 in the first connection area CA1 may be a distance from a bottom surface of the second organic insulating layer OIL2 facing the first wire WL1 to a top surface of the second organic insulating layer OIL2 opposite to the bottom surface of the second organic insulating layer OIL2. The thickness OILt1 of the first organic insulating layer OIL1 in the second connection area CA2 may be a distance from a bottom surface of the first organic insulating layer OIL1 facing the second wire WL2 to a top surface of the first organic insulating layer OIL1 opposite to the bottom surface of the first organic insulating layer OIL1.

The first wire WL1 may be spaced apart from a first surface 100S of the substrate 100 facing the organic layer OL by a first distance d1, in the first connection area CA1. The second wire WL2 may be spaced apart from a second surface 100S2 of the substrate 100 facing the organic layer OL by a second distance d2, in the second connection area CA2. In an embodiment, the first distance d1 and the second distance d2 may be the same as each other.

According to an embodiment, the first wire WL1 and the second wire WL2 may be arranged in different layers from each other, in the first area AR1. In an embodiment, for example, the first wire WL1 may be arranged between the first organic insulating layer OIL1 and the second organic insulating layer OIL2 in the first area AR1, and the second wire WL2 may be arranged between the inorganic insulating layer IIL and the first organic insulating layer OIL1 in the first area AR1. Accordingly, wires may be variously arranged in the first area AR1.

The first wire WL1 may be arranged between the organic layer OL and the second organic insulating layer OIL2, in the first connection area CA1. The second wire WL2 may be arranged between the organic layer OL and the first organic insulating layer OIL1, in the second connection area CA2. Accordingly, the first wire WL1 may be located in the stress neutral plane in the first connection area CA1, and the second wire WL2 may be located in the stress neutral plane in the second connection area CA2. In such an embodiment, the stress applied to the first wire WL1 and second wire WL2 may be reduced.

Figure 9:
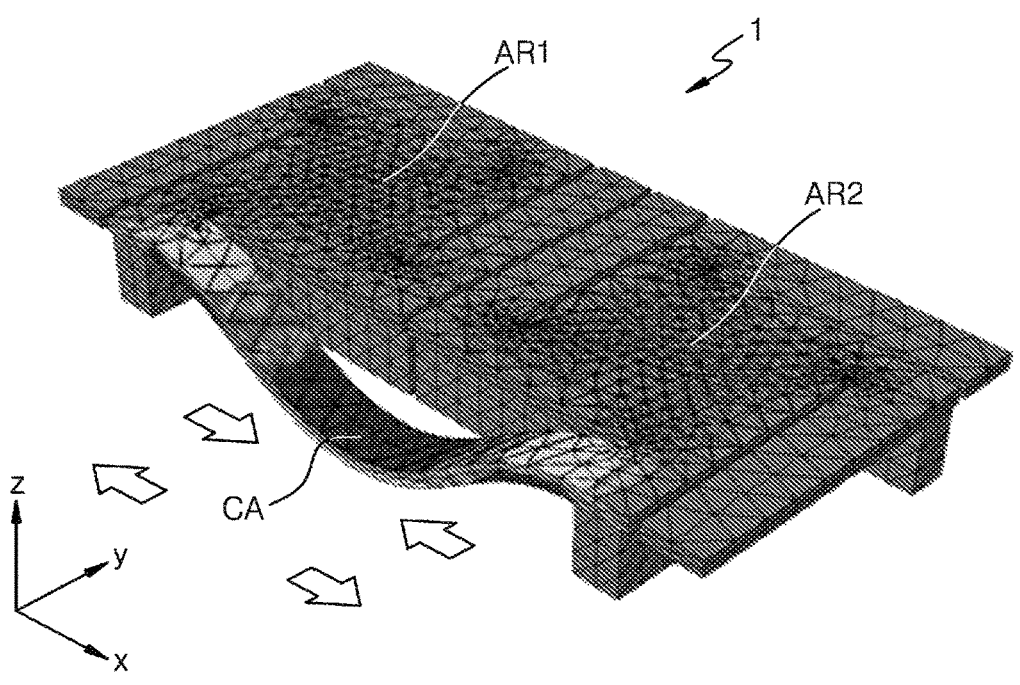
FIG. 9 shows a simulation result showing a shape of the display device of FIG. 5, which is changed when a tensile force or a contraction force is applied to the display device.

FIG. 9 shows a simulation result showing a shape of the display device 1 of FIG. 5, which is changed when a tensile force or a contraction force is applied to the display device 1.

Referring to FIG. 9, the connection area CA may be bent when the tensile force or contraction force is applied to the display device 1, and one portion of the connection area CA may move in the third direction (for example, the z direction or −z direction). In this case, a distance between the first area AR1 and the second area AR2 may be increased or decreased, and the shape of the display device 1 may be changed. As such, when the connection area CA is bent, high stretchability of the display device 1 may be secured.

At this time, it may be desired for a wire arranged in the connection area CA to be located in a stress neutral plane. According to an embodiment, a first wire may be arranged between an organic layer and a second organic insulating layer, in a first connection area. A second wire may be arranged between the organic layer and a first organic insulating layer, in a second connection area. Accordingly, the first wire may be located in the stress neutral plane in the first connection area, and the second wire may be located in the stress neutral plane in the second connection area. In this case, stress applied to the first wire and second wire may be reduced.

Figure 10:
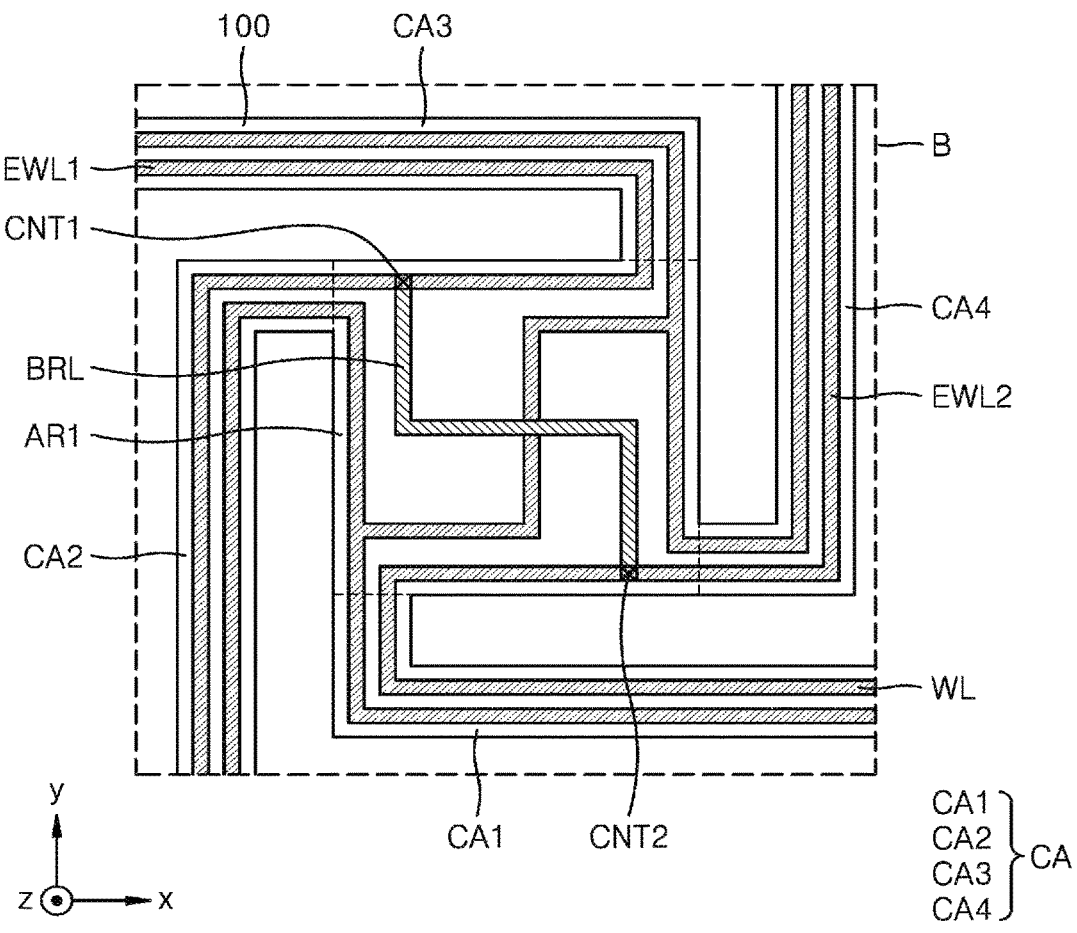
FIG. 10 is an enlarged view of the portion B of the display device of FIG. 5, according to a comparative example.

FIG. 10 is an enlarged view of the portion B of the display device 1 of FIG. 5, according to a comparative example.

Referring to FIG. 10, the comparative example of the display device 1 may include a wire WL and a bridge wire BRL. The substrate 100 may include the first area AR1 and the connection area CA. The connection area CA may extend from the first area AR1.

According to the comparative example, the connection area CA may include the first connection area CA1, the second connection area CA2, the third connection area CA3, and the fourth connection area CA4.

The wire WL may be arranged in the connection area CA. The wire WL may be arranged in the first connection area CA1, the second connection area CA2, the third connection area CA3, and the fourth connection area CA4. There may be a plurality of wires WL. The wire WL may be arranged between an organic layer and a first organic insulating layer in each of the first connection area CA1, the second connection area CA2, the third connection area CA3, and the fourth connection area CA4. In this case, the wire WL may be located in a stress neutral plane in each of the first connection area CA1, the second connection area CA2, the third connection area CA3, and the fourth connection area CA4.

The bridge wire BRL may be arranged in the first area AR1 to connect a first extending wire EWL1 extending from the second connection area CA2 to the third connection area CA3 and a second extending wire EWL2 extending from the first connection area CA1 to the fourth connection area CA4. The bridge wire BRL may be disposed on, for example, the first organic insulating layer. The bridge wire BRL may be connected to the first extending wire EWL1 through a first contact hole CNT1 of the first organic insulating layer, and connected to the second extending wire EWL2 through a second contact hole CNT2 of the first organic insulating layer. In this case, resistance of the first extending wire EWL1, the bridge wire BRL, and the second extending wire EWL2 may be increased. Also, when such a structure of the display device 1 is repeated in the first direction (for example, the x direction or −x direction) and/or the second direction (for example, the y direction or −y direction), the resistance of the first extending wire EWL1, the bridge wire BRL, and the second extending wire EWL2 may be further increased. When the first extending wire EWL1, the bridge wire BRL, and the second extending wire EWL2 are voltage lines, a voltage drop may occur due to the resistance. When the first extending wire EWL1, the bridge wire BRL, and the second extending wire EWL2 are signal lines, a signal may be delayed.

In an embodiment, referring back to FIG. 6A, the first wire WL1 may continuously extend in the first connection area CA1, the first area AR1, and the third connection area CA3 without a connection by the bridge wire BRL. In such an embodiment, the second wire WL2 may continuously extend in the second connection area CA2, the first area AR1, and the fourth connection area CA4 without a connection by the bridge wire BRL. Accordingly, the first wire WL1 and the second wire WL2 may maintain low resistance, and a voltage drop or a signal delay may not occur. In such an embodiment, luminance of the display device 1 may be uniform throughout the display area DA.

FIG. 11A is an enlarged view of the portion B of the display device 1 of FIG. 5, according to an alternative embodiment. FIGS. 11B and 11C are each a plan view showing some of components of FIG. 11A. In FIGS. 11A through 11C, like reference numerals as FIGS. 6A through 6C denote like elements, and any repetitive detailed descriptions thereof will be omitted or simplified.

Referring to FIGS. 11A through 11C, an embodiment of the display device 1 may include the substrate 100, the first organic insulating layer OIL1, the second organic insulating layer OIL2, the first wire WL1, and the second wire WL2. FIG. 11B illustrates the substrate 100, the first organic insulating layer OIL1, the first wire WL1, and the second wire WL2, and FIG. 11C illustrates the substrate 100, the second organic insulating layer OIL2, the first wire WL1, and the second wire WL2.

The substrate 100 may include the first area AR1 and the connection area CA. The connection area CA may extend from the first area AR1. According to an embodiment, the connection area CA may include the first connection area CA1, the second connection area CA2, the third connection area CA3, and the fourth connection area CA4.

The first organic insulating layer OIL1 may be disposed on the substrate 100. The first organic insulating layer OIL1 may extend from the first area AR1 to each of the first connection area CA1 and the third connection area CA3. The first organic insulating layer OIL1 may continuously extend in the first connection area CA1, the first area AR1, and the third connection area CA3. The first organic insulating layer OIL1 may include the first edge OILE1. The first edge OILE1 may match each of the edge of the second connection area CA2 and the edge of the fourth connection area CA4. The first edge OILE1 may extend to cross the second connection area CA2. In such an embodiment, the first organic insulating layer OIL1 may not extend along the second connection area CA2 in a plan view. The first edge OILE1 may extend to cross the fourth connection area CA4. In such an embodiment, the first organic insulating layer OIL1 may not extend along the fourth connection area CA4 in a plan view. The first organic insulating layer OIL1 may include an organic material.

The second organic insulating layer OIL2 may be disposed on the first organic insulating layer OIL1 in the first area AR1. The second organic insulating layer OIL2 may extend along the second connection area CA2, the first area AR1, and the fourth connection area CA4. The second organic insulating layer OIL2 may continuously extend in the second connection area CA2, the first area AR1, and the fourth connection area CA4. The second organic insulating layer OIL2 may include the second edge OILE2. The second edge OILE2 may match each of the edge of the first connection area CA1 and the edge of the third connection area CA3. The second edge OILE2 may extend to cross the first connection area CA1. In such an embodiment, the second organic insulating layer OIL2 may not extend along the first connection area CA1 in a plan view. The second edge OILE2 may extend to cross the third connection area CA3. In such an embodiment, the second organic insulating layer OIL2 may not extend along the third connection area CA3 in a plan view.

The first organic insulating layer OIL1 may extend to the first connection area CA1 across the second edge OILE2 in a plan view. The first organic insulating layer OIL1 may extend to the third connection area CA3 across the second edge OILE2 in a plan view. The second organic insulating layer OIL2 may extend to the second connection area CA2 across the first edge OILE1 in a plan view. The second organic insulating layer OIL2 may extend to the fourth connection area CA4 across the first edge OILE1 in a plan view. Accordingly, any one of the first organic insulating layer OIL1 and the second organic insulating layer OIL2 may be arranged in the connection area CA.

The first wire WL1 may be arranged between the first organic insulating layer OIL1 and the second organic insulating layer OIL2, in the first area AR1. The first wire WL1 may extend from the first area AR1 to each of the second connection area CA2 and the fourth connection area CA4. The first wire WL1 may continuously extend in the second connection area CA2, the first area AR1, and the fourth connection area CA4.

The second wire WL2 may be arranged between the substrate 100 and the first organic insulating layer OIL1, in the first area AR1. The second wire WL2 may extend from the first area AR1 to each of the first connection area CA1 and the third connection area CA3. The second wire WL2 may continuously extend in the first connection area CA1, the first area AR1, and the third connection area CA3.

The first wire WL1 and the second wire WL2 may cross each other in a plan view. According to some embodiments, the first organic insulating layer OIL1 may include the contact hole in the first area AR1, and the first wire WL1 and the second wire WL2 may be connected to each other through the contact hole.

According to an embodiment, the first wire WL1 and the second wire WL2 may include a same material as each other. According to another embodiment, the first wire WL1 and the second wire WL2 may include different materials from each other.

According to an embodiment, as shown in FIGS. 11A to 11C, the first wire WL1 and the second wire WL2 may be arranged in or directly on different layers from each other, in the first area AR1. In an embodiment, for example, the first wire WL1 may be arranged between the first organic insulating layer OIL1 and the second organic insulating layer OIL2, and the second wire WL2 may be arranged between the substrate 100 and the first organic insulating layer OIL1. Accordingly, wires may be variously arranged in the first area AR1. The first wire WL1 may be arranged between the substrate 100 and the second organic insulating layer OIL2, in the connection area CA. The second wire WL2 may be arranged between the substrate 100 and the first organic insulating layer OIL1, in the connection area CA. A portion of the connection area CA may move in the third direction (for example, the z direction or −z direction) when the display device 1 extends or contracts. In this case, it may be important that the first wire WL1 and the second wire WL2 are located in a stress neutral plane in the display device 1. In such an embodiment, the first wire WL1 and the second wire WL2 may be arranged in different layers from each other in the first area AR1, and may each be located in the stress neutral plane in the connection area CA. Accordingly, the stress applied to the first wire WL1 and second wire WL2 may be reduced.

In embodiments of the invention, as described above, a display device may include a first wire disposed on a first organic insulating layer in a first area and disposed on an organic layer in a first connection area. In such embodiments, the first wire may extend along a first side surface of the first organic insulating layer in a direction from the first area to the first connection area. Accordingly, damage to the first wire when the first connection area of the display device changes in any one of various shapes may be prevented or reduced. In such embodiments, because the first wire is disposed on the first organic insulating layer in the first area, various wire arrangements may be possible and an increase in resistance of the first wire may be prevented or reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate including a first area and a first connection area extending from the first area;
   an inorganic insulating layer disposed on the substrate in the first area and having a side surface;
   an organic layer disposed on the substrate, covering the side surface of the inorganic insulating layer and arranged in the first connection area;

a first organic insulating layer disposed on the inorganic insulating layer in the first area and having a first edge facing the first connection area;

a second organic insulating layer disposed on the first organic insulating layer in the first area; and a first wire disposed between the first organic insulating layer and the second organic insulating layer in the first area and disposed directly on the organic layer in the first connection area, wherein the first wire extends in a first direction from the first area to the first connection area, and the second organic insulating layer extends in the first direction beyond the first edge of the first organic insulating layer.

2. The display device of claim 1, wherein the substrate further comprises a second connection area extending from the first area, the organic layer is further arranged in the second connection area, the second organic insulating layer has a second edge facing the second connection area, the first organic insulating layer extends in a second direction from the first area to the second connection area beyond the second edge of the second organic insulating layer, and the display device further comprises a second wire arranged between the organic layer and the first organic insulating layer in the second connection area.

3. The display device of claim 2, wherein a thickness of the second organic insulating layer in the first connection area is the same as a thickness of the first organic insulating layer in the second connection area.

4. The display device of claim 2, wherein the first wire in the first connection area is spaced apart from the substrate by a first distance in a perpendicular direction to a top surface of the substrate, the second wire in the second connection area is spaced apart from the substrate by a second distance in the perpendicular direction to the top surface of the substrate, and the first distance is the same as the second distance.

5. The display device of claim 2, wherein a contact hole is defined through the first organic insulating layer in the first area, and the first wire and the second wire are connected to each other through the contact hole.

6. The display device of claim 2, wherein the first wire and the second wire comprise a same material as each other.

7. The display device of claim 1, wherein the substrate further comprises a second area spaced apart from the first area, the first connection area extends from the first area to the second area, and an edge of the first area, an edge of the first connection area and an edge of the second area in a plan view define at least a portion of an opening area of the substrate.

8. The display device of claim 1, further comprising a light-emitting element disposed on the second organic insulating layer.

9. A display device comprising:

a substrate including a first area, and a first connection area, a second connection area, a third connection area and a fourth connection area, which extend from the first area respectively;

a first organic insulating layer disposed on the substrate and extending along the second connection area, the first area, and the fourth connection area;

a second organic insulating layer disposed on the first organic insulating layer in the first area, and extending from the first area to each of the first connection area and the third connection area;

a first wire arranged between the first organic insulating layer and the second organic insulating layer in the first area, and extending from the first area to each of the first connection area and the third connection area;

a second wire arranged between the substrate and the first organic insulating layer in the first area, and extending from the first area to each of the second connection area and the fourth connection areas;

an inorganic insulating layer arranged between the substrate and the first organic insulating layer in the first area, and having a side surface; and an organic layer disposed on the substrate, covering the side surface of the inorganic insulating layer and arranged in each of the first connection area and the second connection area, wherein the first wire in the first connection area is spaced apart from the substrate by a first distance in a perpendicular direction to a top surface of the substrate, the second wire in the second connection area is spaced apart from the substrate by a second distance in the perpendicular direction to the top surface of the substrate, and the first distance is the same as the second distance.

10. The display device of claim 9, wherein a thickness of the second organic insulating layer in the first connection area is the same as a thickness of the first organic insulating layer in the second connection area.

11. The display device of claim 9, wherein the first organic insulating layer includes a first edge, and the second organic insulating layer extends to the first connection area across the first edge in a plan view.

12. The display device of claim 9, wherein the second organic insulating layer includes a second edge, and the first organic insulating layer extends to the second connection area across the second edge in a plan view.

13. The display device of claim 9, wherein the first wire and the second wire cross each other in the first area in a plan view, a contact hole is defined through the first organic insulating layer in the first area, and the first wire and the second wire are connected to each other through the contact hole.

14. The display device of claim 9, wherein the first wire and the second wire comprise a same material as each other.

15. The display device of claim 9, wherein the substrate further comprises a second area spaced apart from the first area, the first connection area extends from the first area to the second area, and an edge of the first area, an edge of the first connection area and an edge of the second area define at least a portion of an opening area of the substrate.

16. The display device of claim 9, wherein the first organic insulating layer has a first side surface, and the first wire extends surface in a direction from the first area to the first connection area.

17. The display device of claim 9, further comprising:

a light-emitting element disposed on the second organic insulating layer in the first area.

\* \* \* \* \*